(12) United States Patent
Kouta et al.

(10) Patent No.: US 7,154,926 B2
(45) Date of Patent: Dec. 26, 2006

(54) LASER DIODE MODULE, LASER APPARATUS AND LASER PROCESSING APPARATUS

(75) Inventors: Hikaru Kouta, Tokyo (JP); Hisaya Takahashi, Tokyo (JP); Hideyuki Ono, Tokyo (JP); Yuuzou Ikeda, Tokyo (JP); Masaki Tunekane, Tokyo (JP); Toshinori Ishida, Kanagawa (JP); Keiichi Kubota, Tokyo (JP)

(73) Assignee: Laserfront Technologies, Inc. (JP)

( * ) Notice: Subject to any disclaimer, the term of this patent is extended or adjusted under 35 U.S.C. 154(b) by 301 days.

(21) Appl. No.: 10/942,809

(22) Filed: Sep. 17, 2004

(65) Prior Publication Data

US 2005/0069266 A1 Mar. 31, 2005

(30) Foreign Application Priority Data

Sep. 29, 2003 (JP) ............................. 2003-336594

(51) Int. Cl.
*H01S 3/00* (2006.01)
(52) U.S. Cl. ................ 372/38.05; 372/87; 372/29.013; 372/33; 372/36
(58) Field of Classification Search ........... 372/29.013, 372/38.05, 87, 88, 33, 36
See application file for complete search history.

(56) References Cited

U.S. PATENT DOCUMENTS

| 4,792,884 | A | * | 12/1988 | Suman et al. ............... 362/135 |
|---|---|---|---|---|
| 4,881,118 | A | * | 11/1989 | Niwayama et al. ......... 257/179 |
| 5,978,396 | A | | 11/1999 | Duchemin et al. |
| 5,985,684 | A | * | 11/1999 | Marshall et al. .............. 438/26 |
| 6,205,160 | B1 | * | 3/2001 | Grewell ....................... 372/36 |
| 6,266,353 | B1 | * | 7/2001 | Freitas et al. ................. 372/36 |
| 6,700,913 | B1 | * | 3/2004 | Pinneo et al. ............ 372/43.01 |
| 2003/0122261 | A1 | * | 7/2003 | Bijlenga et al. ............ 257/777 |
| 2003/0142711 | A1 | | 7/2003 | Treusch et al. |
| 2004/0207070 | A1 | * | 10/2004 | Kaufmann et al. ......... 257/704 |

FOREIGN PATENT DOCUMENTS

| EP | 0 805 527 A2 | 11/1997 |
|---|---|---|
| JP | 09-129986 | 5/1997 |
| JP | HEI 10-041580 | 2/1998 |
| JP | HEI 10-507318 | 7/1998 |
| JP | HEI 10-209531 | 8/1998 |
| WO | WO-97/03487 | 1/1997 |

\* cited by examiner

*Primary Examiner*—Minsun Oh Harvey
*Assistant Examiner*—Tod T. Van Roy
(74) *Attorney, Agent, or Firm*—Dickstein, Shapiro, LLP.

(57) ABSTRACT

Submount substrates are connected to both sides of a laser diode via hard solders. The lower submount substrate and a heat sink are connected together by a soft solder. The heat sink and a presser electrode are fixed with a predetermined gap therebetween via an insulating spacer. A coil electrode is fitted in a V-shaped groove of the presser electrode. As the coil electrode is deformed slightly elastically, the coil electrode is pressed against the upper submount substrate.

15 Claims, 15 Drawing Sheets

LASER DIODE MODULE, LASER APPARATUS AND LASER PROCESSING APPARATUS

BACKGROUND OF THE INVENTION

1. Field of the Invention

The present invention relates to a module incorporating a laser diode, a laser apparatus having the module mounted therein, and a laser processing apparatus.

2. Description of the Related Art

A high-power laser diode is used as a light source for exciting a solid-state laser and a light source for laser-beam processing. The efficiency of conversion from electrical energy to optical energy to stimulate a laser diode is as high as about 50%. When a laser beam is output from the laser diode, therefore, heat as high as or higher than the optical energy of the laser beam is generated in the laser diode. For example, the laser diode that generates light of 50 W generates heat of 50 W or higher. As the temperature of the laser diode rises, the electricity-to-light conversion efficiency falls, and the emission life is shortening. Further, as the temperature shifts the oscillation wavelength, the temperature rise of the laser diode stands in the way of causing light excitation. This requires that some means of suppressing a temperature rise originated from generated heat should be taken in the laser diode.

A module incorporating the laser diode is mainly comprised of three components; a laser diode, a heat sink which cools down the laser diode and electrodes which energize the laser diode. The heat sink often serves as an electrode of the laser diode.

Recently, a laser diode module which can generate a high-power laser beam is demanded as a light source for efficiently welding, cutting by melting, boring and annealing of materials of metal or so. To meet the needs, achievement of high-power laser diodes has been studied. A laser diode bar which is formed by arranging active regions for generating laser beams sideways in a single chip has been developed as a means of achieving high power.

FIG. 1 is a perspective view showing this laser diode bar 101. The laser diode bar 101 generally has a size of {10 mm (width)}×{1.0 to 1.5 mm (cavity length)}×{100 to 150 μm (thickness)}. The top and bottom sides of the laser diode bar 101 are electrode surfaces 104, and one of the sides of the laser diode bar 101 is an emission side 102 which outputs a laser beam. On the emission side 102, emission regions 103 are arranged in a line in the widthwise direction, and the number and width of the emission regions 103 are designed to be optimized by the necessary output. The current is supplied via the top and bottom electrode surfaces 104, causing the emission regions 103 to emit light. Laser diode bars that have output power of 10 W to 100 W are commercially available. Gallium arsenide (GaAs) is mainly used for the substrate for forming a laser diode bar.

The following describes a conventional laser diode module in which a laser diode that generates high-power light is mounted. FIG. 2 shows a module in which a laser diode bar disclosed in Japanese Patent Laid-Open Publication No. H10-209531 is mounted. The module is a laminated body 201 in which laser diodes each mounted on a heat sink are laminated longitudinally. The module has a basic structure wherein a laser diode bar 203 is mounted via a solder layer to a water-cooled heat sink 202 which also serves as a lower electrode. The upper electrode of the laser diode bar 203 and a metal sheet 205 placed on a rubber sheet 204 provided for insulation to the heat sink 202 are interconnected by bonding wires 206. A coolant is supplied via a coolant passage 207 to the heat sink 202 of each layer. Instead of the bonding wire, ribbon-bonding, a metal plate or a metal film may be used as a wire. There has been proposed a module in which a substrate having about the same thermal expansion coefficient as that of a laser diode is provided between the laser diode and a heat sink.

FIG. 3 shows a laser diode module disclosed in Japanese Patent Laid-Open Publication No. H9-129986. A laser diode 301 is sandwiched by terminal plates 302 and 304 which have about the same thermal expansion coefficients as that of the laser diode 301, and the top and bottom sides of the laser diode 301 are fixed by hard solder layers 303 and 305. The lower terminal plate 302 is fixed to a heat sink 308 by an elastic adhesive or a soft solder layer 306. A lead terminal 307 is connected to the upper and lower terminal plates 302 and 304 for electrical interconnection. As the terminal plate 302 and the laser diode 301 which have approximately the same thermal expansion coefficients, the junction interface is not deteriorated even if the temperature of the laser diode fluctuates up and down. The Japanese Patent Laid-Open Publication No. H9-129986 discloses that because the difference between the thermal expansion coefficients of the bottom side of the terminal plate 302 and the heat sink 308 is relaxed by the elastic adhesive or soft solder layer 306, degrading of the cooling performance of the junction part can be suppressed. A mirror surface layer 310 (reflection layer for laser emission) is provided at a side surface of the laser diode 301. The heat sink 308 is provided with a cooling member 311, so that a coolant 314 is guided to a coolant guide portion 312. The coolant 314 cools down the laser diode.

FIG. 4 shows a laser diode module 401 disclosed in Japanese Patent Laid-Open Publication No. H10-41580. A laser-diode first side 415 is fixed to an inner side 403 of a heat absorber 407 by a first solder 402. A laser-diode second side 416 is fixed to an inner side 405 of a lid 408 by a second solder 404. A laser diode is sandwiched between the heat absorber 407 and the lid 408. A bottom side 406 of the heat absorber 407 is connected to a heat accumulator, and the laser diode is cooled down by thermal conduction of the heat absorber 407. The heat absorber 407 and the lid 408 are formed of plastically deformable metals. An outer side 409 of the heat absorber 407, an outer side 410 of the lid 408 and a bottom side 417 of the lid 408 are not mounted on a solid package body. Even when the laser diode module 401 warps due to thermal expansion, the shapes of the heat absorber 407 and the lid 408 follow up the warping. Accordingly, no deformation occurs and no degrading of the cooling performance of the junction part occurs as disclosed in the publication. A discharge side 411 of the laser diode is level with a top side 413 of the heat absorber 407 and an upper end 414 of the lid 408. A groove 418 for supplying solder at the time of connecting several modules laid side by side is formed in the upper outer surface of the heat absorber 407.

FIG. 5 shows the structure of a laser diode module disclosed in Japanese National Publication of the translated version No. H10-507318. In the module, a laser diode stack 503 that has plural laser diodes and heat canceling sheets sandwiched alternately is mounted between a fixed part 501 which also serves as an upper electrode and a base 502 which also serves as a heat sink and a lower electrode. A spring 504 is intervened between the laser diode stack 503 and the fixed part 501. The laser diode stack 503 is sandwiched between the fixed part 501 and the base 502 via the spring 504. Japanese National Publication of the translated version No. H10-507318 also shows the use of a screw instead of the spring 504. The upper and lower electrodes (the fixed part 501 and base 502) are insulated by an insulating sheet 505. The module is characterized in that no solder is used between the laser diode and the heat canceling sheet and between the laser diode stack 503 and the upper and lower electrodes, and the electric contact between the laser diode stack 503 and the base 502 or the fixed part 501 is made only by pressing of the spring 504 in the upper and lower directions. Si, SiC or copper tungsten is used for the heat canceling sheet, and the material selected has a higher thermal expansion coefficient than a GaAs substrate which constitute the laser diode. Because the prior art structure does not use a solder, it is easy to assemble. The illustrated example achieves laser oscillation with a pulse of 100 ms.

The prior arts disclosed in the Japanese Patent Laid-Open Publication No. H10-20953, the Japanese Patent Laid-Open Publication No. H9-129986, the Japanese Patent Laid-Open Publication No. H10-41580 and the Japanese National Publication of the translated version No. H10-507318 do not raise problems if the average output power of the laser diode module is less than 10 W. In case of a high-power laser diode bar whose average output power is 20 W or greater, however, there is a high probability that the output power gradually decreases and the electrodes are eventually disconnected. Especially when the ON and OFF states of the oscillation light of the laser diode with an interval of several seconds or so are repeated, the probability of causing power reduction, disconnection and shifting of the oscillation wavelength increases, thereby shortening the service life. To overcome the problems, the laser diode in the module should be cooled down stably over a long period of time. This requires improvements on the following three issues associated with cooling of the laser diode.

(1) Decomposition of the solder layer that connects the heat sink and the laser diode (2) Decomposition of the contact between the laser diode and the upper electrode (3) Warping and deformation of the laser diode.

The problem 1 will be explained in detail. Conventionally, a laser diode or a submount substrate on which a laser diode is mounted and which has about the same thermal expansion coefficient as that of the laser diode is mounted on a heat sink using a soft solder. The soft solder is connected to the heat sink and the laser diode or the submount substrate as it is alloyed with the metal of the mount interface, e.g., gold. The alloyed phase is grained and is spotted in an unalloyed soft solder layer. The alloyed phase differs from the unalloyed soft solder layer in thermal expansion coefficient. Given that the temperature of the laser diode when the laser diode is set on with predetermined power is T1 and the temperature of the laser diode when the laser diode is set off is T2, the temperature of the laser diode fluctuates between T1 and T2 at maximum. When the temperature rise and fall are repeated, deformation of the interface between the alloyed phase and the soft solder phase becomes greater, micro cracks would occur at the interface. As the thermal resistance of the portion where the crack occurs becomes higher, the temperature locally rises there. As the temperature rises, the diffusion of metal atoms at the mount interface in the soft solder is accelerated, thus increasing the probability of causing voids due to the Kirkendall effect that is brought about by the growth of the alloyed grain or the metal diffusion. The growth of those cracks or voids further increases the thermal resistance of the whole solder layer, thus increasing the temperature of the laser diode to lower the output power and shifting the oscillation wavelength. Finally, large cracks occur at the junction portion. As the cracks or voids are grown, the laser diode or the submount substrate having the laser diode mounted thereon cannot be connected to the heat sink by a soft solder layer and is partly peeled off. The partial peeling off increases the temperature at the peeled off portion, thereby further accelerating alloying of the vicinity portion and metal diffusion. This makes the portion to be peeled off larger and raises the temperature of the chip, so that the soft solder may be melted and dropped off or oxidized to be insulated from the heat sink. The conventional module shown in FIG. 3 has no means for suppressing the decomposition of the soft solder layer. In the case of a module which does not use a solder as in the prior art in FIG. 5, there is no degrading of the soldered portion so that the problem 1 does not occur, but mere pressing without soldering makes it very difficult to obtain a low thermal resistance between the heat sink and the laser diode which is needed to continuously output light with average power of 10 W or higher.

The problem 2 will be explained in detail below. When the ON-OFF states of the laser diode are repeated frequently, the temperature of the junction portion to the upper electrode of the laser diode fluctuates up and down for the same reason given in the description of the problem 1. The wiring of the upper electrode of the laser diode is conventionally made mainly by bonding wires or a bonding ribbon as shown in FIG. 2, or is achieved as the plate electrode is fused with a solder or thermally compressed. When bonding wires or a bonding ribbon of the same material as the upper electrode of the laser diode is used, a matrix of grains with different crystal orientations is present at the solidified portion due to the influence of the spontaneous fusion solidification at the time of connection, though no alloy is present. When a solder is used, alloying with the surface metal yields an alloyed grain. As the connected portion suffers a large deformation and its temperature fluctuates up and down, cracks are produced in the grain interface due to the anisotropy of thermal expansion or difference in thermal expansion, eventually causing disconnection. An increase in electric resistance originated from the deformation of the connected portion or the increased cracks may generate heat at the connected portion. When the electrode is partly separated, the current is concentrated on the remaining connected portion. This further increases the load on the connected portion, generating heat, so that most of the entire connected portion of the electrode may be separated eventually.

The problem 3 will be explained in detail next. A laser diode is formed by film deposition on a GaAs substrate. Because the film deposition is done on only one side of the substrate, the laser diode does not have a composition symmetry in the thicknesswise direction. This makes a slight difference in thermal expansion coefficient in the thicknesswise direction, so that the laser diode may warp. In the case of the laser diode bar shown in FIG. 1, particularly, as the ratio of the cavity length to the width is large, the laser diode is likely to warp in the widthwise direction along which its length is longer. Even though there is no warping of the laser diode at the time of mounting, the temperature rises during laser output, making the force to cause warping greater. As a result, cracks occur at the junction interface between the laser diode and the heat sink or the submount substrate, producing a thermally-disconnected portion which would heat up the laser diode. This may bring about the problems 1 and 2. In case where the high-power laser diode is sandwiched between the plastically deformable heat absorber and the lid and is cooled from the bottom of the heat absorber as in the prior art in FIG. 4, it is extremely difficult to cool down the heat of 20 W or greater with cooling of the thermoconductive system by the heat absorber while warping of the laser diode is allowed. If the laser diode warps, the direction of light to be output changes, raising an application problem.

In short, when the average output power of the laser diode module becomes high, the structure and mode of the conventional laser diode module suffer a difficulty in obtaining a stable output over a long period of time.

SUMMARY OF THE INVENTION

Accordingly, it is an object of the present invention to provide a laser diode module capable of outputting a laser beam stably over a long period of time, and a laser apparatus and a laser processing apparatus which employ the laser diode module.

A laser diode module according to one aspect of the present invention includes a laser diode; a first substrate and a second substrate connected to both electrode surfaces of the laser diode via respective first solder layers; a heat sink connected to the first substrate via a second solder layer; a presser electrode arranged at a predetermined gap with respect to the heat sink; and a coil electrode provided between the second substrate and the presser electrode in such a way as to have an axial direction in parallel to the second substrate, whereby the presser electrode presses the coil electrode against the second substrate.

In the laser diode module, for example, the presser electrode may be fixed to the heat sink at a predetermined gap via an insulating spacer, and as the coil electrode is deformed elastically, the coil electrode may be pressed against the second substrate.

It is preferable the coil electrode should have a gold (Au) layer coated on an outer surface of a coil wire. It is further preferable that the first substrate and the second substrate should be connected to the entire electrode surfaces of the laser diode in entirety.

A hard solder containing a main element selected from a group of Au, Ag, Al, Si and Ge is used for the first solder layer, a soft solder containing a main element selected from a group of Pb, Sn, In, Sb and Bi is used for the second solder layer, and the hard solder has a higher melting point than the soft solder.

It is preferable that a gold (Au) layer should be coated on junction surfaces of the laser diode with respect to the first and second substrates, a gold layer should be coated on junction surfaces of the first and second substrates with respect to the laser diode, and a hard solder comprised of an AuSn alloy should be used for the first solder layer.

For example, a first metal layer is formed on each of opposing surfaces of the heat sink and the first substrate, and an alloy phase is formed at an interface between the first metal layer and the second solder layer.

It is preferable that the ratio of the alloy phase to that of the second solder layer which remains unalloyed should be controlled in such a way that the second solder layer after formation of the alloy phase on a top surface thereof has a sufficient thickness to relax deformation caused by a difference between a thermal expansion coefficient of the first substrate and a thermal expansion coefficient of the heat sink.

For example, a gold layer is formed on each of opposing surfaces of the heat sink and the first substrate, and a soft solder of In is used for the second solder layer. In this case, for example, an alloy phase is formed between each of the gold layers formed on the opposing surfaces of the heat sink and the first substrate and an In layer of the second solder layer as gold is diffused in the In layer. It is preferable that the ratio of the alloy phase to that of the In layer which remains unalloyed should be controlled in such a way that the In layer after formation of the alloy phase on a top surface thereof has a sufficient thickness to relax deformation caused by a difference between a thermal expansion coefficient of the first substrate and a thermal expansion coefficient of the heat sink. Furthermore, for example, the laser diode is formed on a GaAs substrate, and the first and second substrates are formed of a copper-tungsten alloy.

According to another aspect of the present invention, there is provided an arrayed laser diode module having at least two laser diode modules described above arranged sideways, wherein that portion of the presser electrode which does not lie above the coil electrode is connected to the heat sink of an adjoining one of the laser diode modules.

A laser apparatus according to the invention uses the laser diode module as a pumping source for a solid-state laser crystal.

A laser processing apparatus according to the present invention includes a laser apparatus incorporating the laser diode module recited above; an optical fiber for stimulating light generated from said laser apparatus; a lens for condensing light output from said optical fiber; and an irradiation system which irradiates a laser beam condensed at a predetermined position.

The invention overcomes the problems 1 to 3 of the prior arts as follows.

(1) Decomposition of the Solder Layer that Connects the Heat Sink and the Laser Diode Due to the grains that are formed by alloying of the metal at the interface and the soft solder at the time of connection, cracks or voids are produced during later emission of a laser diode. However, the production of cracks or voids is restrained to keep the plasticity for relaxing the difference in thermal expansion between the heat sink and the laser diode, which is the role of the soft solder, thereby suppressing the thermal resistance of the soft solder layer from becoming high.

(2) Decomposition of the Contact Between the Laser Diode and the Upper Electrode The deformation of the sandwiched assembly of the laser diode and the electrode interface is relaxed by using a contact type coil electrode as the upper electrode.

(3) Warping and Deformation of the Laser Diode

Warping and deformation of the laser diode are repressed by sandwiching the top and bottom sides of the laser diode between two substrates which have about the same thermal expansion coefficients as that of the laser diode.

As the effects that brought about by the means of overcoming the problems 1, 2 and 3 have a correlation, those effects will be discussed below in association with one another.

To suppress decomposition of the solder layer that connects the heat sink and the laser diode which is recited in the problem 1, and maintain the function of the layer that relaxes the thermal expansion difference, the first way is to suppress the alloying ratio of the metal at the junction surface and the soft solder at the time of mounting. The function of the stress relaxing layer can be maintained by making the unalloyed soft solder portion remaining over a long period of time after mounting. The alloying ratio can allow the laser diode to be controlled by the thickness of the soft solder layer on the heat sink before mounting. With the type of the metal of the top surface to be contacted, the mounting temperature and the mounting condition of the fusion time being fixed, and with the thickness of the soft solder layer before mounting taken as a parameter, the necessary thickness of the soft solder can be defined by checking the thickness of the soft solder layer and the probability of failure of the module as shown in FIG. 6.

The second way is to suppress the growth of alloyed grains produced in the soft solder layer and new production of the grains and suppress the occurrence of cracks or voids during light output of the laser diode. To achieve the way, it is necessary to suppress the occurrence of micro cracks and voids in the soft solder layer or to suppress the growth of micro cracks and voids, if occurred. The thermal resistance of the solder layer can be maintained by pressing the mount surface of the laser diode against the heat sink. If micro cracks and voids are produced, the soft solder enters the space to suppress a rise in thermal resistance, so that the growth of grains, cracks and voids is restrained, resulting in maintenance of the stable junction interface. As the pressing force is made uniform over the entire mount surface, suppression of degrading over the surface can be made uniform.

To overcome the problem 1, as discussed above, it is important to repress degrading of the soft solder layer by pressing the laser diode against the heat sink with uniform force. If the laser diode is directly pressed against the heat sink via the soft solder, however, the laser diode would break. Further, it is difficult to uniformly press the entire surface of the laser diode. The laser diode can however be protected if submount substrates which can endure the pressing force better than the laser diode are provided on the top and bottom sides of the laser diode. The submount substrates selected should have about the same thermal expansion coefficients as that of the laser diode.

The size of the submount substrates in use should have about the same size as or larger than the laser diode, and the entire surfaces of the upper and lower electrodes of the laser diode are connected to the submount substrates using a hard solder into a sandwiched structure. The sandwiching should be done in such a way that the light generated from the laser diode does not hit the submount substrates. From the viewpoint of providing good symmetry at the time of thermal expansion, it is desirable that the upper and lower submount substrates have the same size. The submount substrates should have thicknesses enough not to deform against the force by which a temperature change would cause the laser diode to warp. With the structure, even when the laser diode emits light and is thermally expanded, the submount substrates are likewise thermally expanded, hardly causing deformation at the junction interface, so that the warping of the laser diode is restrained. This overcome the problem 3. As the heat generated by the laser diode is dispersed in the upper and lower submount substrates, the temperature uniformity becomes better and the oscillation wavelength has a good stability. The sandwiched assembly has such a structure as not to deform even with external application of force.

The sandwiched assembly is mounted on the heat sink by a soft solder. Thereafter, a coil obtained by winding a metal wire in a spiral form is used to press the entire heat-sink side surface of the sandwiched assembly against the surface of the heat sink vertically with uniform force. As the length of the coil electrode is set approximately equal to the length of the sandwiched assembly in the lengthwise direction and the sandwiched assembly is pressed against the heat sink vertically along nearly the lengthwise center line of the sandwiched assembly, uniform pressing of the sandwiched assembly against the mount surface becomes possible.

The use of the coil as the upper electrode can overcome the problem 2 or decomposition of the contact between the laser diode and the upper electrode for the following reason. The coil electrode has the adequate elasticity in the radial direction. As alloying in the soft solder layer progresses, changing the average density of the soft solder portion and making the soft solder layer slightly thinner, the coil electrode, if having elasticity large enough for the probable thickness change, can keep pressing the sandwiched assembly against the heat sink. Even when the sandwiched assembly or the soft solder portion becomes thicker due to thermal expansion or so, the winding diameter of the coil changes so that pressing force greater than necessary is not applied. The limit of the pressing force lies within the plasticity limit of the coil electrode (the force that does not restore the deformed shape). With the use of the submount substrates that can endure the plasticity limit of the coil, the sandwiched assembly is not deformed with the pressing force of the coil.

The elasticity of the coil can be adjusted by changing the material, the diameter of the wire, and the winding diameter or so. To hold the contact area of the coil needed to let the necessary current to flow for emission of the laser diode, the thickness of the metal wire to be used for the coil is controlled to secure the area of the contact between the sandwiched assembly and the presser electrode. The coil, the submount substrates the coil contacts, and the coil presser electrode are merely in contact with one another, not fused. Even when the laser diode is turned on and off, raising or decreasing the temperature, the junction portion originated from the storage of the deformation stress is neither degraded nor disconnected. The coil presser electrode is prepared of a metal such as copper and into a rigid structure.

In case of the laser diode module that uses a coil electrode, even when the laser diode abnormally generates heat due to a problem on the laser diode or a problem on the solder layer, resulting in a failure in the laser diode and melting of the soft solder, there is no possibility that the current does not flow. The reason for the phenomenon will be given below for such is very effective when the invention is adapted to an arrayed module having laser diode modules arranged sideways. Normally, when a single laser diode module in an arrayed module has a trouble and part of the electric circuitry becomes open, oscillation of all the laser diodes in the arrayed module stops. When the coil electrode is used, however, the laser diode is always pressed against the heat sink or the lower electrode via the associated submount substrate, the electric circuitry does not become open. As a result, even if one module has a problem, the other modules keep emitting light. Therefore, the operations of a laser apparatus and a laser processing apparatus which uses the arrayed laser diode module of the invention do not abruptly stop due to the disconnection of the module electrode and those apparatuses achieve a high reliability. As the coil electrode is not melted to either the sandwiched assembly or the presser electrode, it is easy to replace a single failed module, so that the laser apparatus and the laser processing apparatus have a high maintenanceability. As the presser electrode of the coil serves to electrically connect to an adjoining module, a spacer for insulating between the electrodes becomes unnecessary. This leads to reduction in the cost of the parts and the assembling cost.

The "hard solder" in the present invention is defined as a solder containing a main element selected from a group of Au, Ag, Al, Si and Ge, and the "soft solder" is defined as a solder containing a main element selected from a group of Pb, Sn, In, Sb and Bi. In the present invention, the melting point of the hard solder in use should be higher than the melting point of the soft solder.

The first effect of the laser diode module lies in that a time-dependent change in thermal resistance at the junction surface area to the heat sink for cooling the high-power laser diode bar can be suppressed. Even when the invention is applied to a field where the ON-OFF states of the laser diode are frequently changed and the temperature of the laser diode rises and falls intensely, particularly, a change in thermal resistance at the junction interface can be suppressed over a long period of time. This can ensure stable laser emission. Further, a high electricity-to-light conversion efficiency can be kept over a long period of time. This can prolong the service life of the laser diode.

The second effect is such that the coil electrode is not fused to any of the laser diode, the submount substrate and the presser electrode, so that the laser diode module can be assembled easily at a low cost.

The third effect is concerned with an arrayed module having the modules arranged sideways, and is such that as the coil presser electrode also serves as electric connection to an adjoining module and is connected only to the coil electrode and the adjoining heat sink, no insulating material is needed for assembling the module, significantly reducing the number of components and thus realizing a low-cost and high-performance arrayed laser diode module.

The fourth effect is such that in case where the modules are interconnected in series, even if the laser diode in one module in the array fails, the electric circuitry does not become open, so that a laser apparatus and a laser processing apparatus which incorporate this module is free of an open-circuitry failure. This can provide a laser apparatus and a laser processing apparatus excellent in reliability over a long period of time and low running cost.

DETAILED DESCRIPTION OF THE PREFERRED EMBODIMENTS

Figure 7:
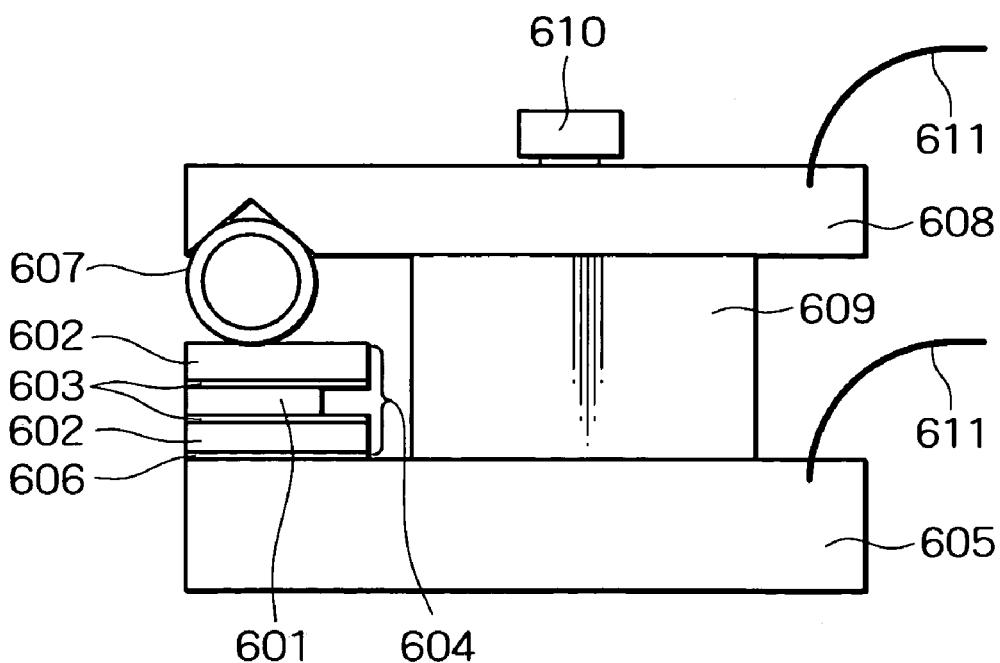
FIG. 7 is a front view showing a laser diode module according to a first embodiment of the invention.

Preferred embodiments of the invention will be described in detail below with reference to the accompanying drawings. FIG. 7 is an exemplary diagram showing a laser diode module according to the first embodiment of the invention. The upper and lower electrodes of a laser diode 601 are connected to submount substrates 602 with hard solders 603. This sandwiched assembly 604 is connected to a heat sink with a soft solder 606. The ratio of the metal at the junction interface to the phase of the alloy with a soft solder is adjusted in such a way that a thermal expansion difference between the sandwiched assembly 604 and the heat sink 605 can be relaxed after connection by controlling the thickness of a soft solder layer 606 before connection. A coil electrode 607 formed by tightly winding a metal wire is used as the upper electrode. The position of the coil is fixed at the V-shaped portion of a presser electrode 608. The coil electrode 607 and the sandwiched assembly 604 are held between the heat sink 605 and the presser electrode 608. The insulation between the heat sink 605 and the presser electrode 608 is done by an insulating spacer 609. The force of the presser electrode 608 pressing on the coil electrode 607 is adjusted by the thickness of the insulating spacer 609 to lie in such a range as not to plastically deform the coil electrode 607. The heat sink 605 and the presser electrode 608 are secured by an insulated setscrew 610. A terminal wire 611 for the flow of the current is connected to the heat sink 605 and the presser electrode 608.

Figure 8:
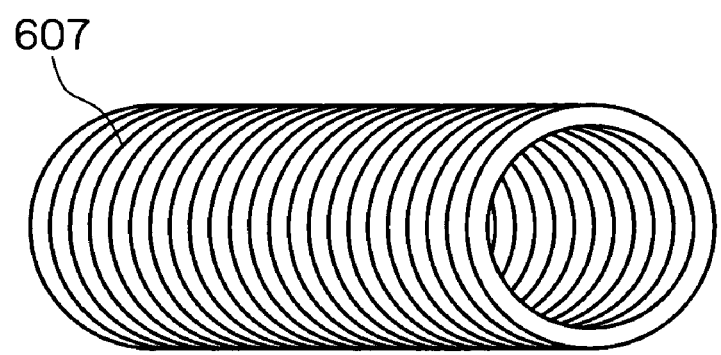
FIG. 8 is a perspective view showing a coil electrode to be used in the laser diode module.
Figure 9:
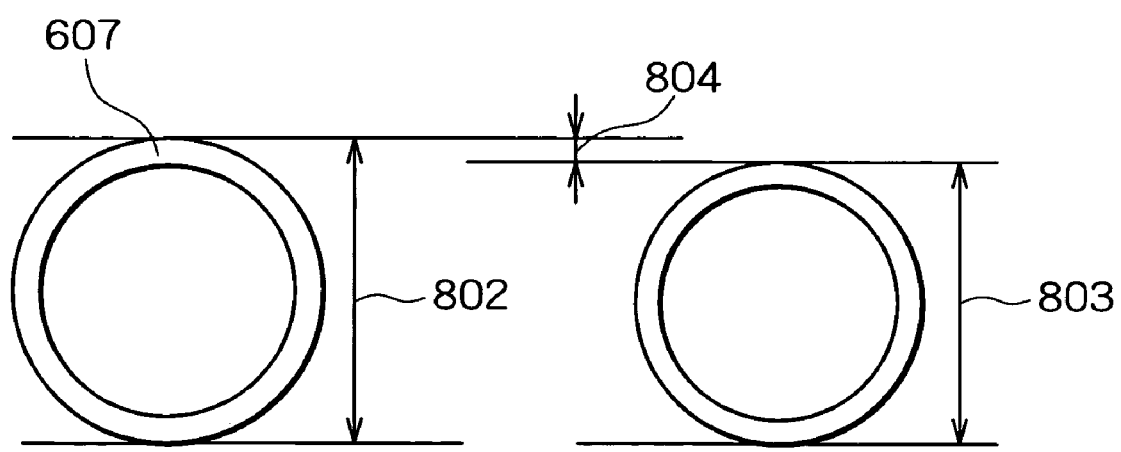
FIG. 9 is an exemplary diagram showing the changeable range of the coil electrode to be used in the laser diode module.

FIG. 8 shows a cylindrical winding of a metal wire as an example of the coil electrode 607. It is desirable that the surface of the coil wire should be coated with a gold layer. As shown in FIG. 9, a movable range 804 between the coil diameter, 802, of the coil electrode 607 and a diameter 803 at which the coil electrode 607 is deformed and starts plastic deformation is the range where the coil electrode 607 can elastically deform. With the coil electrode 607 pressed within the movable range 804 where the coil electrode 607 shows elasticity in the radial direction of the coil, releasing the pressure can allow the coil electrode 607 to return to the original diameter 802. The module in FIG. 7 is pressed to deform from above by the presser electrode 608 in such a way that a change in the diameter of the coil lies in the movable range 804. The coil electrode 607 has a length approximately the same as the lengthwise size of the laser diode.

The following describes a method of fabricating the laser diode module according to the first embodiment shown in FIG. 7. First, a metal layer of, for example, gold is deposited on the upper and lower electrodes of the laser diode. The submount substrate 602 is formed of a material, e.g., copper tungsten, which has about the same thermal expansion coefficient as the thermal expansion coefficient of a laser diode fabricated using a GaAs substrate (5.6 to 6.2 ppm/K), and is processed to an area equal to or greater than the area of the upper or lower electrode of the laser diode. A metal layer of, for example, gold is also deposited on the top surface of the submount substrate 602. The hard solder 603 comprised of, for example, gold tin for mounting of the laser diode 601 is deposited on one side of the submount substrate 602.

Figure 10:
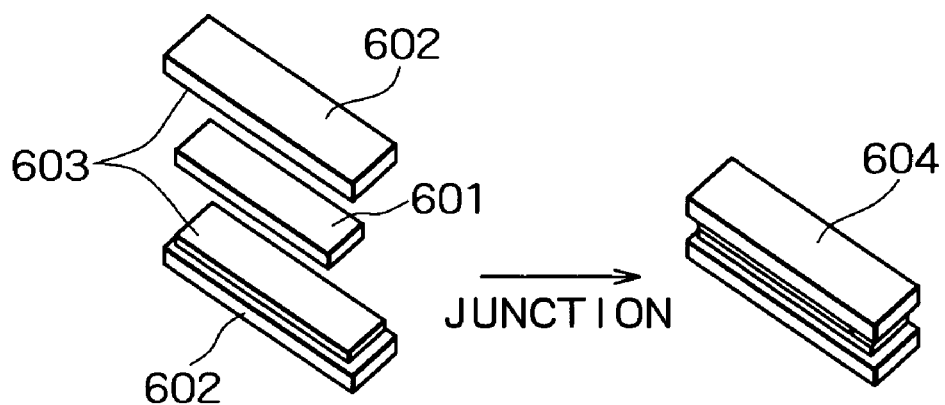
FIG. 10 is a diagram illustrating a method of forming a sandwiched assembly having a laser diode connected to two submount substrates via a first solder layer in the laser diode module.

As shown in FIG. 10, the top and bottom sides of the laser diode 601 are sandwiched by those sides of the submount substrates 602 where the hard solders 603 are deposited and are heated to the melting point of the hard solder 603, thereby yielding the sandwiched assembly 604 of the laser diode sandwiched by the submount substrates 602.

Figure 11:
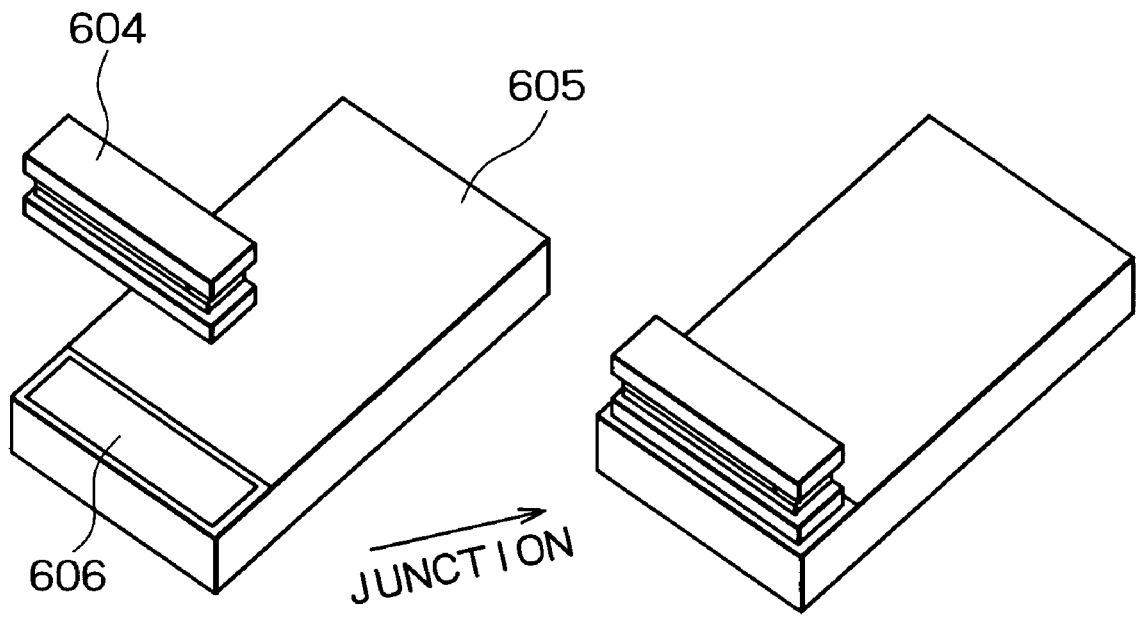
FIG. 11 is a diagram illustrating a method of mounting the sandwiched assembly shown in FIG. 10 to a heat sink using a second solder layer.

Next, the sandwiched assembly 604 is connected to the heat sink 605 as shown in FIG. 11. A water-cooled type which is mainly composed of copper, for example, and has a water passage formed inside can be used as the heat sink 605. A gold layer, for example, is deposited on the top surface of the heat sink 605. As shown in FIG. 11, an In layer, for example, as a soft solder 606, is deposited on that side of the heat sink 605 where the sandwiched assembly 604 is to be mounted, preceding to mount the sandwiched assembly 604. Then, the heat sink 605 is heated to melt In layer to join the sandwiched assembly 604 with the heat sink 605.

Figure 12:
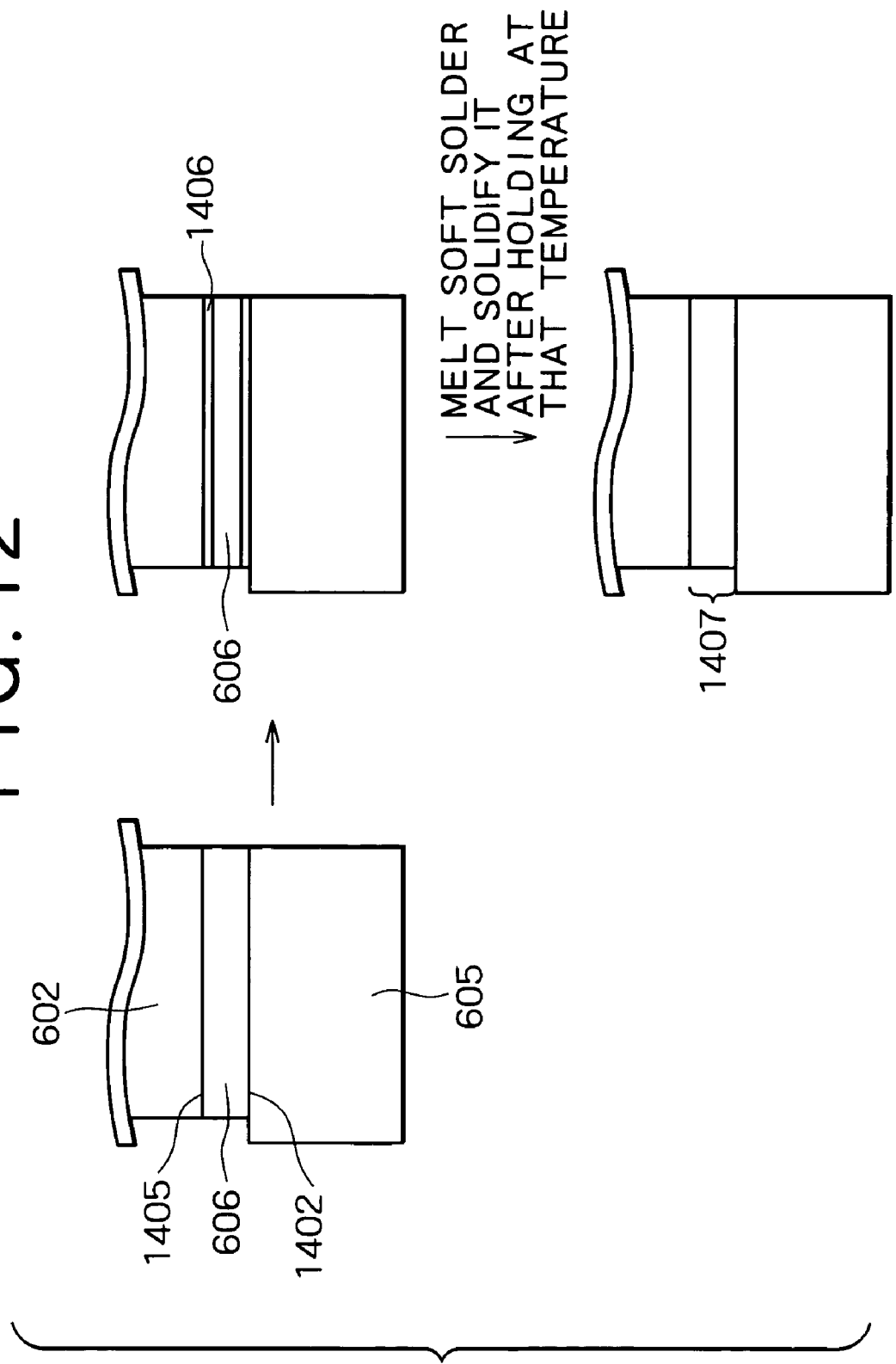
FIG. 12 is a cross-sectional view showing a state of a submount substrate before mounted to the heat sink by the second solder layer and a mounted state of the submount substrate.

FIG. 12 is an enlarged view of the interface of the In solder layer before and after connection. The sandwiched assembly 604 comprised of two submount substrates 602 and the laser diode bar 601 shown in FIG. 10 is mounted on the soft solder 606 deposited on a metal 1402 at the top surface of the heat sink 605 in such a way that a metal-on-submount-substrate 1405 provided at the lower junction surface of the sandwiched assembly 604 is held between the submount substrate 602 and the soft solder 606. As the temperature of the soft solder 606 rises to the melting point, first, surface metals 1402 and 1405 are diffused in the soft solder 606 to be alloys, forming alloy regions 1406. Then, the soft solder 606 is melted and the temperature is maintained. Accordingly, the alloyed grain is dispersed in the entire solder layer and after the solder layer is solidified, a region 1407 where the alloyed grain is dispersed is formed on the entire solder layer.

Next, as shown in FIG. 7, the coil electrode 607 is placed on the top of the sandwiched assembly 604 and the insulating spacer 609 is placed on the heat sink 605. The coil electrode 607 is pressed by the presser electrode 608, which has gold deposited on the surface formed of, for example, copper, and the presser electrode 608 is fixed to the heat sink 605 via the spacer with the insulated setscrew 610, thereby completing the module of the embodiment.

The second embodiment of the invention will now be described.

Figure 13:
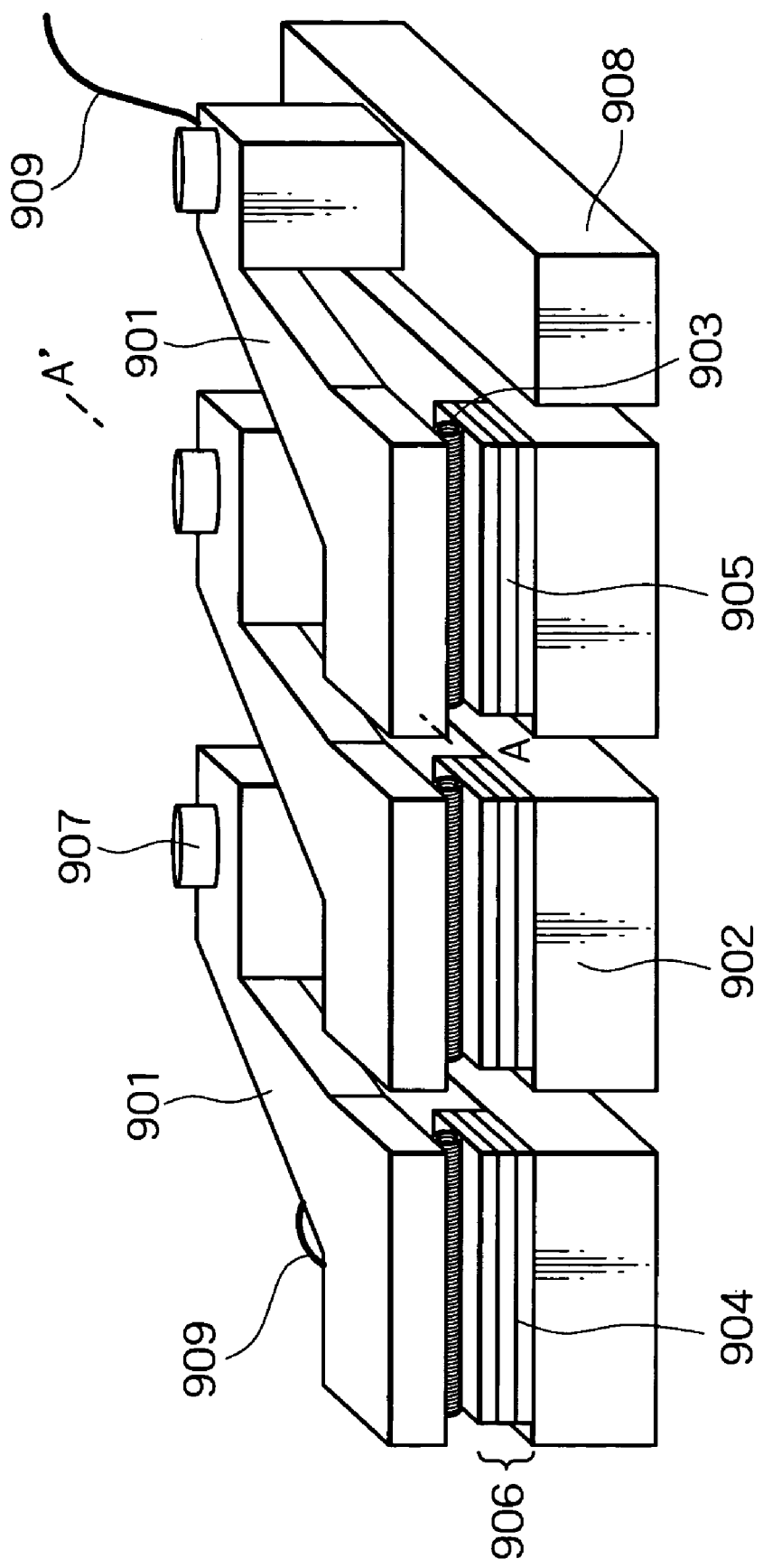
FIG. 13 is a perspective view showing a laser diode module according to a second embodiment of the invention.
Figure 14:
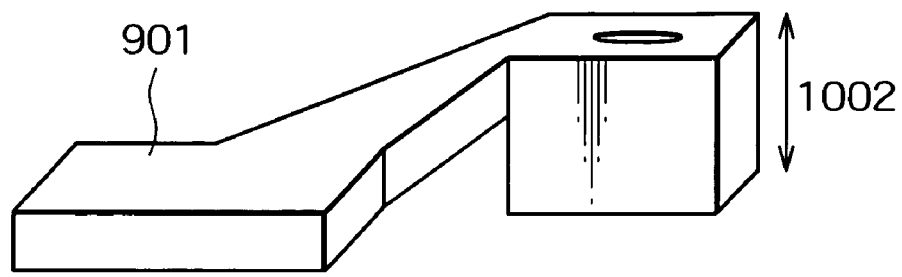
FIG. 14 is a perspective view showing a bridge presser electrode in an extracted form which is used in the laser diode module.
Figure 15:
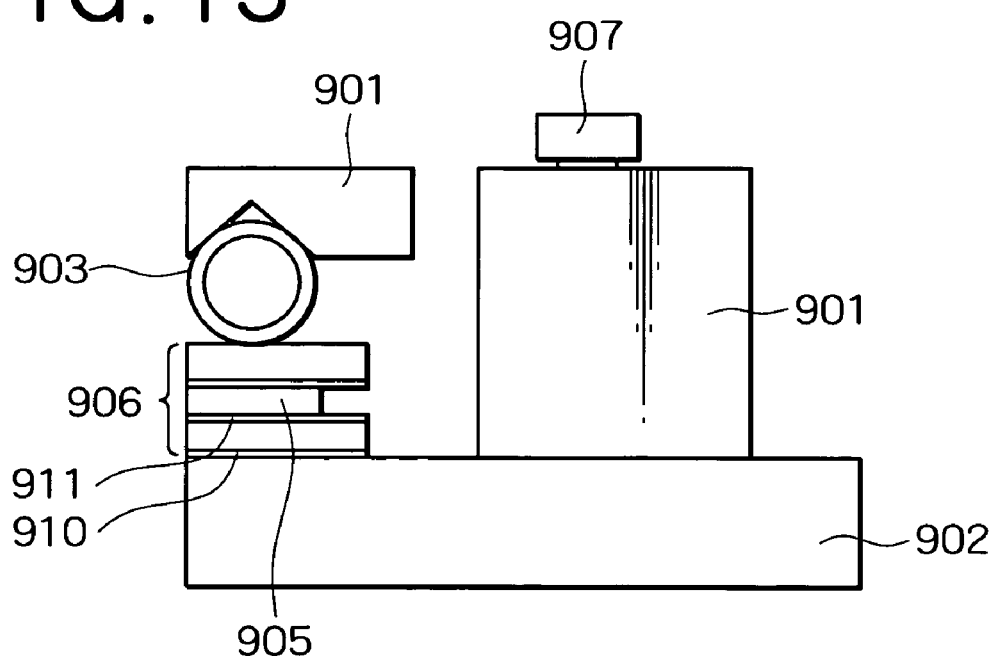
FIG. 15 is a cross-sectional view along line A–A' in FIG. 13.

FIG. 13 is a perspective view showing an arrayed laser diode module having laser diode modules arranged sideways according to the second embodiment of the invention. FIG. 14 is a perspective view showing a bridge presser electrode 901 in FIG. 13 in an extracted form. FIG. 15 is a cross-sectional view showing the arrayed laser diode module in FIG. 13 taken along line A–A'. The bridge presser electrode 901 for pressing a sandwiched assembly 906 of a laser diode 905 held between submount substrates 904 with an upper coil electrode 903 fixed is connected only to a heat sink 902 of an adjoining module, and is secured by a setscrew 907. The rightmost bridge presser electrode 901 in FIG. 13 is fixed to a fixing stand 908 and is connected to a terminal wire 909. Each module does not require a material for insulation between the upper and lower electrodes. By adjusting a height 1002 of the heat sink contact portion of the bridge presser electrode 901, the force of pressing the coil electrode can be adjusted. Another bridge presser electrode 901 contacting one heat sink is in contact with the coil electrode 903 and the heat sink 902 and the bridge presser electrode 901 contacting the heat sink 902 is secured to the heat sink 902 with the setscrew 907. The current that is supplied from the heat sink 902 flows into the laser diode 905 in the sandwiched assembly 905 via the soft solder 606 (see FIG. 12). The upper portion of the coil electrode 903 in the bridge presser electrode 901 is connected to the adjoining heat sink 902.

Figure 16:
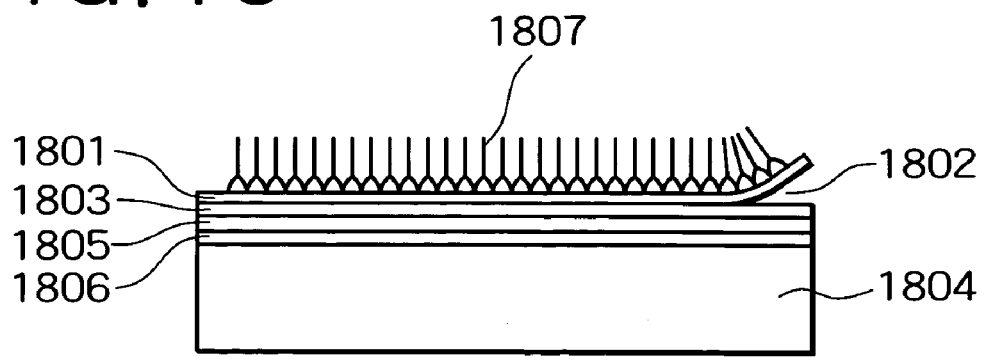
FIG. 16 is a diagram showing the state of a laser diode module having an upper electrode formed by the conventional method of using bonding wires after running evaluation, as seen from that side of the module which outputs light.

The arrayed module shown in FIG. 13, like those shown in FIGS. 10 and 16, is mounted on the heat sink after the sandwiched assembly of the laser diode is prepared. Then, after a coil spring is placed on the sandwiched assembly, the coil spring is pressed by the rigid bridge presser electrode 901 which is in turn fastened by the setscrew 907, thereby fabricating the arrayed module. The setscrew 907 for securing the bridge presser electrode 901 need not be insulated and can be secured to the heat sink 902 by an ordinary screw.

The submount substrate can be made of a material other than copper tungsten, such as copper molybdenum, molybdenum and so on, whose thermal expansion coefficient matches with the thermal expansion coefficient of the GaAs substrate (5.6 to 6.2 ppm/K) within a margin of ±20% and which has a low electric resistance and a high thermal conductivity.

Besides the gold-tin alloy, a solder mainly consisting of Au, Ag, Al, Si or Ge can be used as the hard solder. Besides In, a solder mainly consisting of Pb, Sn, In, Sb or Bi can be used as the soft solder. It is essential that the hard solder should have a higher melting point than the soft solder. The solder layer indicates a region between two interfaces with both materials to be connected by the solder, and includes a region where the solder is mixed with the grain of the alloy phase which is produced by diffusion of the surface metal. When the sandwiched assembly is mounted on the heat sink with In used for the solder layer, the solder layer changes as follows. First, before mounting, the solder layer is a layer formed only of In. At the initial stage of mounting, a layer where alloy grains (crystal grains) produced by reaction of In with gold in the phase of In which is not reacted with gold in the surface metal are spotted is formed near the junction interface, thereby forming a three-layer structure with the layer of only In at the center. After a predetermined time elapses, the solder layer becomes a layer in which alloyed crystal grains are spotted in the entire In phase.

Besides the water-cooled type having a water passage formed inside, a heat sink using a Peltier device, a heat pipe type, a thermal conductive type and so forth are available as the heat sink.

An element mainly consisting of copper and tightly wound is suitable for the element of the coil electrode. The element has only to have elasticity in the radial direction, which is equal to or greater than the maximum amount of a change in the sum of at least a change in the thickness originated from decomposition of the soft solder layer and a change in the thickness originated from the thermal expansion or so of the sandwiched assembly. If the contact for letting a predetermined current to flow can be secured, the coil need not be tightly wound. While it is desirable that the top surface of the coil wire should be coated with a gold layer, the gold layer can be replaced with a layer of a metal which does not easily corrode in the air.

The presser electrode 608 has a V-shaped groove as a portion to press the coil electrode 607. Besides the V-shaped groove, the pressing portion can take various shapes, such as a semicircular groove or a trapezoidal groove. Although a laser diode bar has been explained as the main adaptation of the module in the foregoing description, the module is effective for a laser diode with a single light emission region.

A metal layer of a corrosion-resistive material, such as nickel, besides corrosion-resistive gold, can be used for the top surfaces of the submount substrate, the heat sink, the coil electrode and the presser electrode. Nickel, if used, is difficult to form an alloy with a solder, and thus normally rises a problem on adhesion. When the interface is pressed by the coil electrode, however, physical adhesion can be maintained even though chemical adhesion is weak, so that the thermal resistance at the interface can be maintained.

EXAMPLE 1

To demonstrate the effects of the invention, the characteristics of examples that fall within the scope of the invention and the characteristics of comparative examples which are out of the scope of the invention will be discussed. A laser diode array bar having a width of 10 mm, a cavity length of 1.2 mm and a thickness of 100 µm and capable of providing an output of 50 W and submount substrates formed of CuW having a width of 10 mm, a length of 1.2 mm and a thickness of 0.15 mm were prepared. A gold layer was formed 1 µm thick on the topmost surfaces of the upper and lower electrodes of the laser diode. Gold was plated 1 µm thick on the topmost surfaces of both submount substrates, and a gold-tin solder was deposited 2 µm thick on the other sides. After the laser diode bar was sandwiched by the two submount substrates with the gold-tin soft solder sides facing to the top and bottom sides of the laser diode bar in such a way that the light emission sides of the laser diode bar matched with the submount substrates, the temperature was raised to the melting point temperature of the gold-tin solder to connect the laser diode to the submount substrates, yielding a sandwiched assembly wherein the laser diode was sandwiched by the submount substrates. The heat sink in use was a water-cooled type having a base material of copper, having a water passage formed inside, and having a longitudinal size of 25 mm, a lateral size of 12 mm and a thickness of 2.0 mm. A gold layer was formed 1 µm thick on the topmost surface of the heat sink. In layers vapor-deposited as a soft solder on regions of 10×1.2 mm having the same area as the area of the submount substrate at intervals of 1 µm from 1 µm to 10 µm were prepared. After the sandwiched assembly was placed on the vapor-deposition surfaces, the temperature of the heat sink was raised to the temperature at which In was melted, was held at that temperature for a predetermined time, and was then cooled to connect the sandwiched assembly to the heat sink. A coil electrode provided by gold-plating the surface of a coil of 10 mm in length obtained by tightly winding a copper wire with an outside diameter of 1.5 mm and a thickness of 0.2 mm was placed on the top portion of the sandwiched assembly mounted on the heat sink, and was pressed from above with a presser electrode formed of copper and having the surface plated with gold, and was fixed to the heat sink by a ceramic screw via an insulating spacer of aluminum nitride. As the changeable range of the coil electrode where the diameter would not be plastically deformed was 30 µm, the thickness of the spacer was adjusted in such a way that the diameter of the coil was squashed by about 20 µm. The life test of the laser diode module prepared this way was conducted. The thickness of the In solder layer and the probability of failures of the module were checked under the test conditions that the module was run for 3000 hours while the continuous light of 50 W from the module was enabled and disabled at intervals of 0.5 second.

Figure 1:
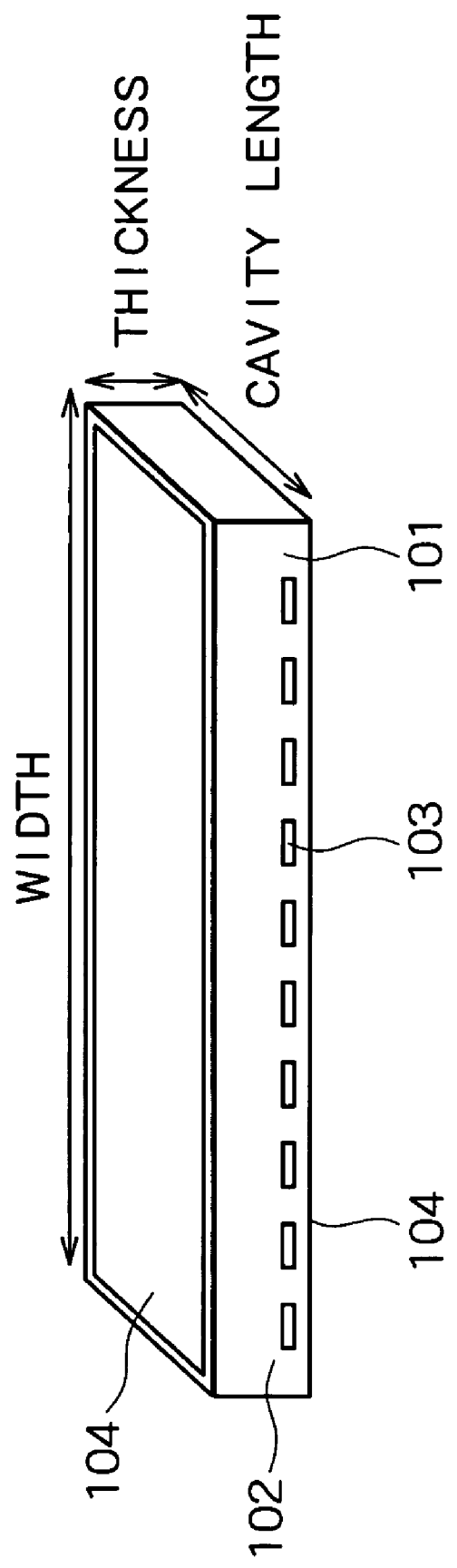
FIG. 1 is a perspective view showing a conventional laser diode bar.
Figure 2:
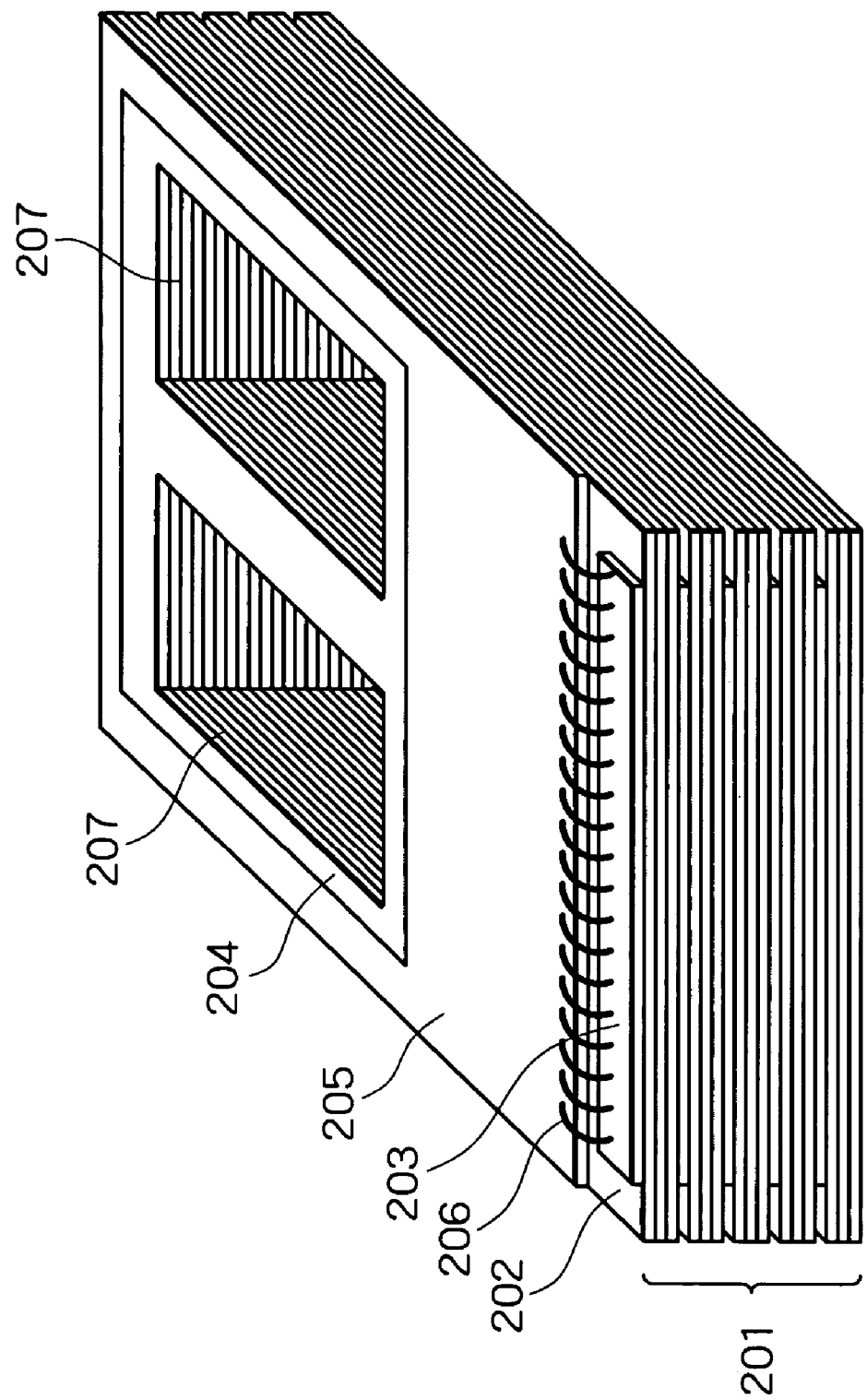
FIG. 2 is a perspective view showing a conventional vertically stacked laser diode module in which bonding wires are used as an upper electrode.
Figure 3:
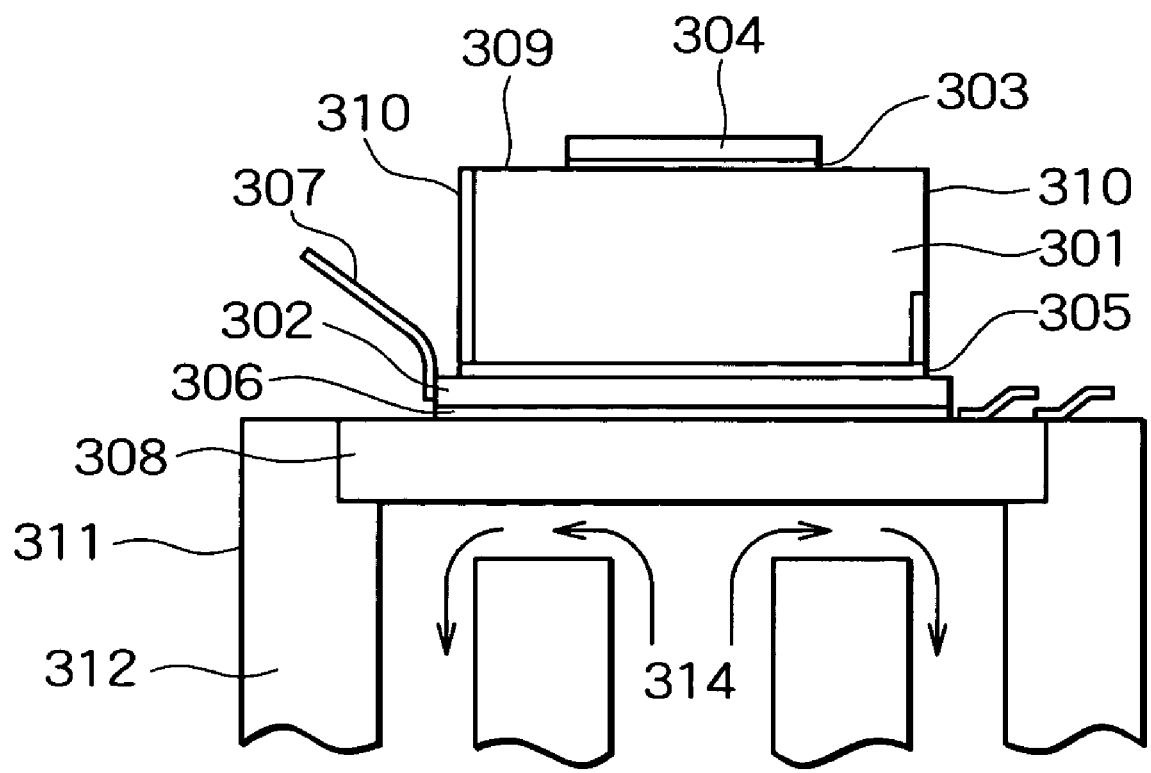
FIG. 3 is a front view showing a conventional laser diode module in which a laser diode connected to two terminal plates with a first solder is connected to a cooling member with a second solder.
Figure 4:
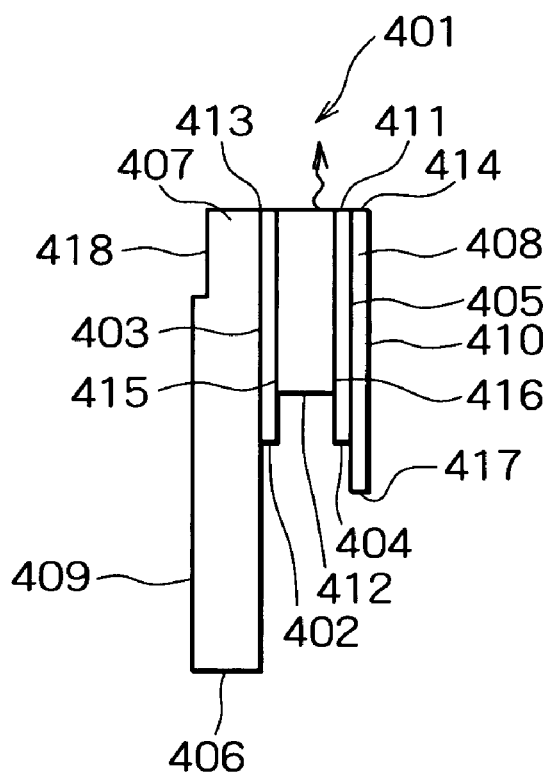
FIG. 4 is a plan view showing a conventional laser diode module sandwiched by a plastically deformable heat absorber and a lid.
Figure 5:
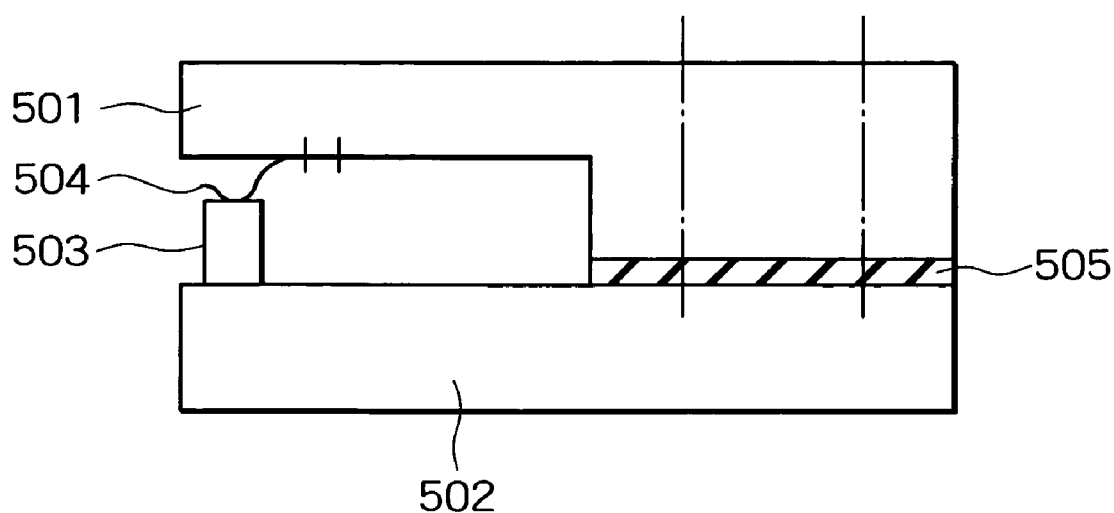
FIG. 5 is a plan view showing a conventional laser diode module in which a stack of laser diodes and heat canceling sheets alternately stacked without using a solder is pressed against the base with a spring secured to a fixing portion.
Figure 6:
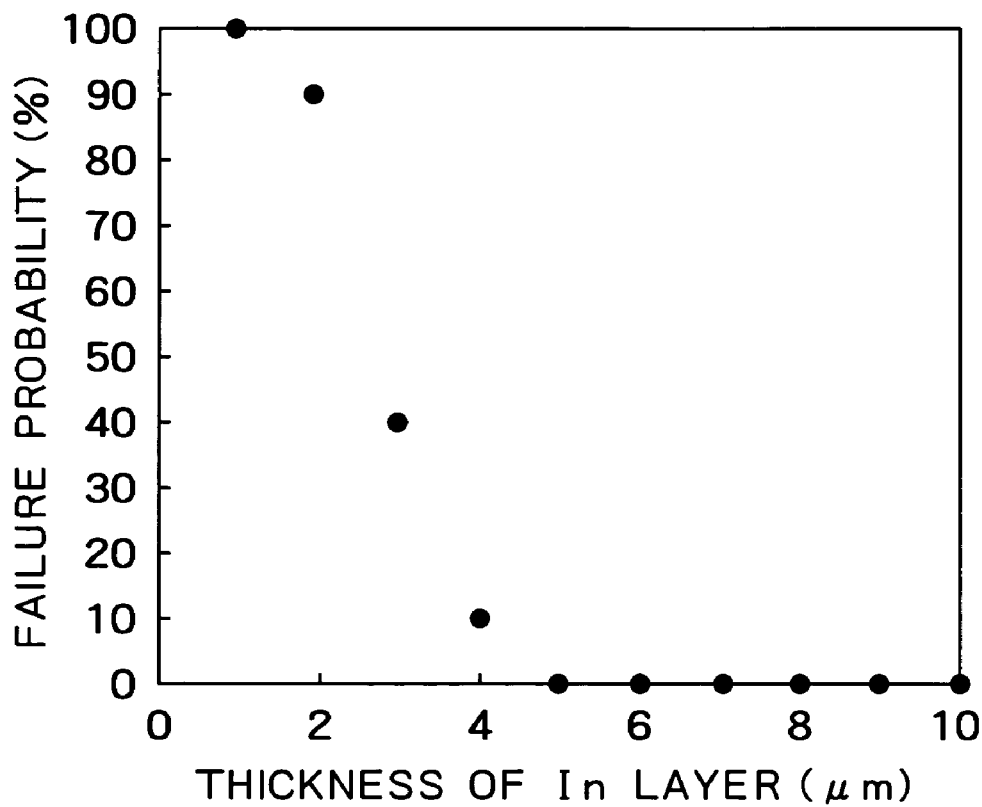
FIG. 6 is a graph showing the relationship between the thickness of an indium layer and the probability of failures when a running test is conducted on a module using indium for the second solder.

The results of the test are shown in FIG. 6. FIG. 6 is a graph showing the relationship between the thickness of the In layer taken on the horizontal axis and the probability of failures taken on the vertical axis. A "failure" indicates a case where the output drops by 20% or more with respect to the initial output or a case where at least a part of the electrode is disconnected. When gold was deposited 1 µm thick on the top surfaces of the heat sink and the submount substrate which would contact In, the failure probability could be reduced to 0.1% or less, which would be a target for commercialization, by forming the sandwiched assembly with the In solder layer deposited to a thickness of 5 µm or greater. The results show that with the structure and the mount conditions of the module described above, the thickness of the In layer needed for the In solder layer to relax the deformation caused by the difference in thermal expansion coefficient between the submount substrates of copper tungsten and the heat sink of copper is 5 µm or greater.

The output characteristics of the module of the first substrate (Example 1) and the conventional module (Comparative Example) were compared with each other. In the conventional module used, a laser diode bar was mounted on submount substrates of copper tungsten with a hard solder, was mounted on the heat sink with a soft solder, and the upper electrode was formed by using ordinary bonding wires.

Figure 17:
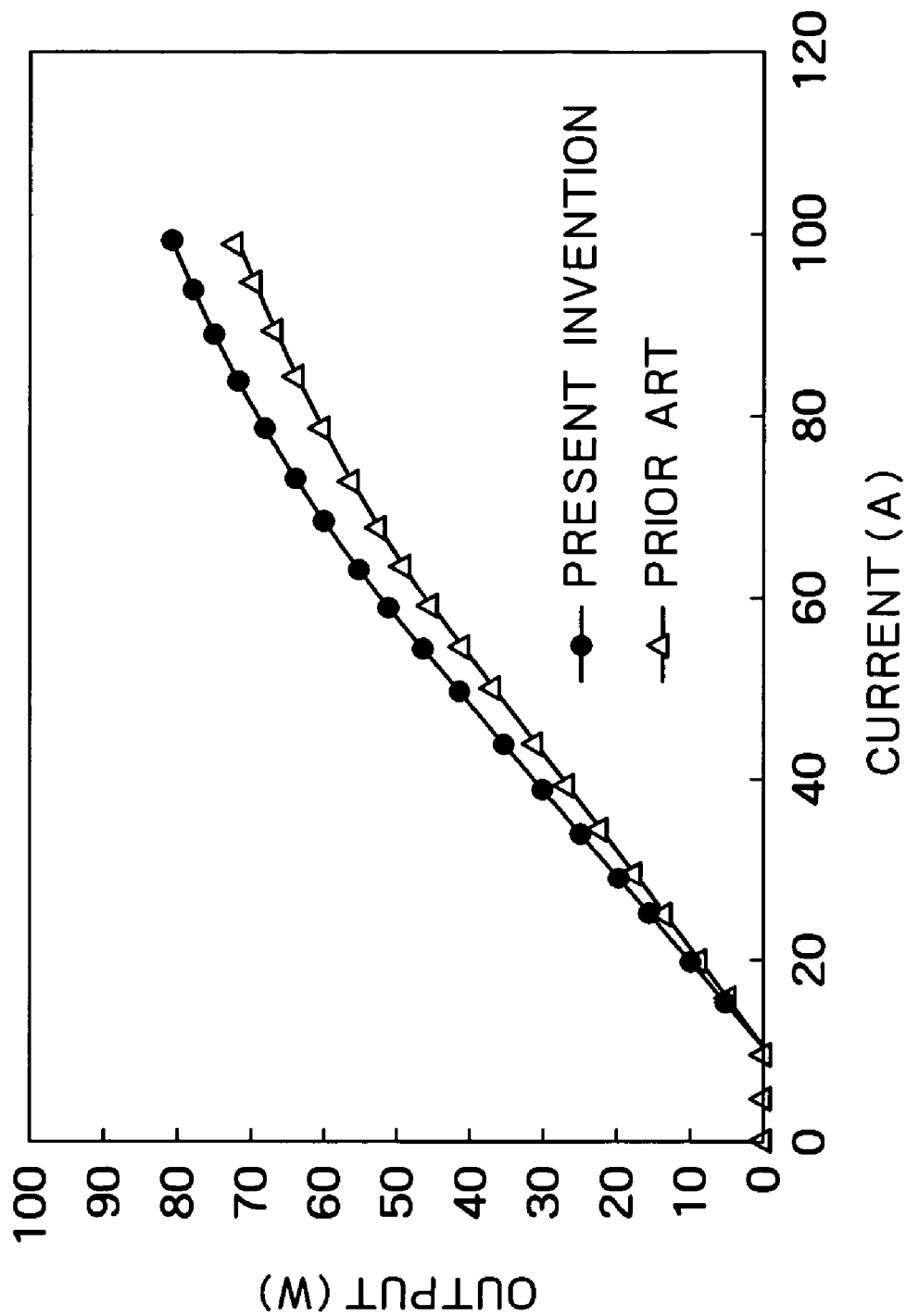
FIG. 17 is a graph showing the relationship between the current and optical output when the current is let to flow in the laser diode module of the invention and the conventional laser diode module using bonding wires.

FIG. 17 shows the results of comparing changes in the outputs of both modules observed with the current let to flow in the modules. In FIG. 17, the horizontal axis shows the current (A) and the vertical axis shows the output (W). The module that uses the coil electrode showed an output improvement of approximately 10%. This is because the laser diode bar is pressed from above with the coil electrode, the thermal resistance of the soft solder layer becomes lower than that in the case where the bonding-wire electrode is used.

Figure 18:
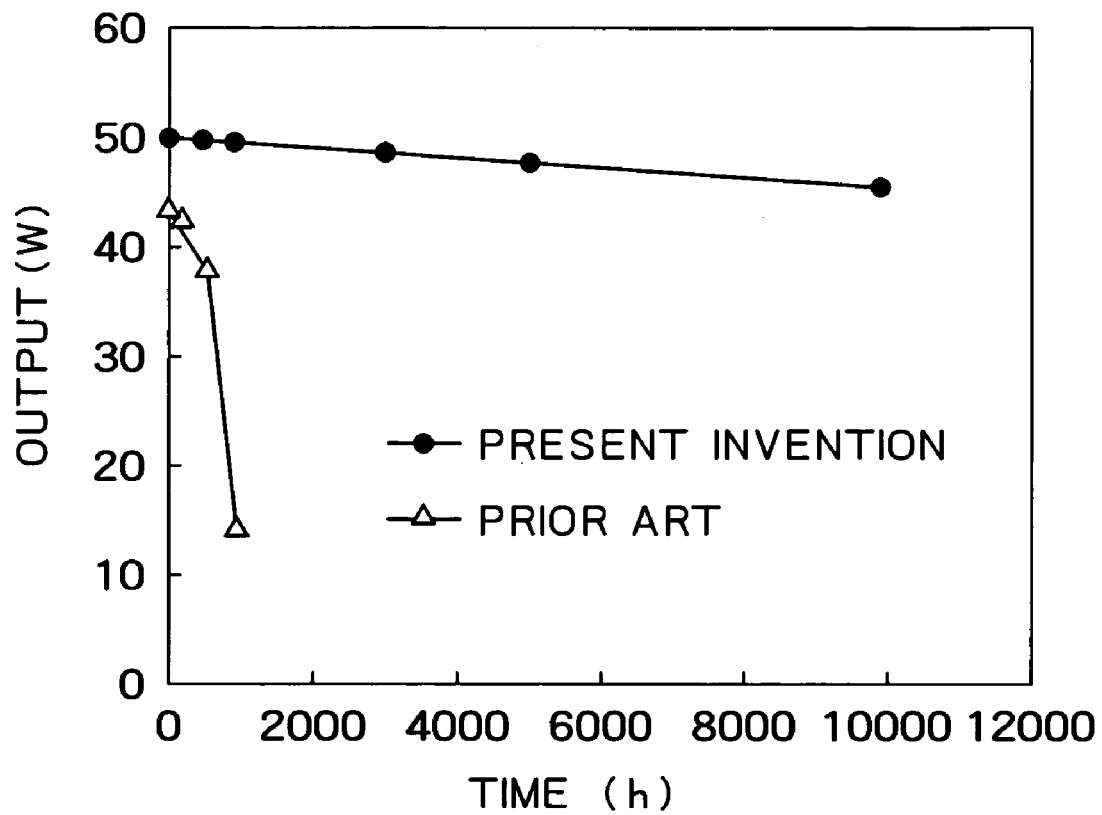
FIG. 18 is a graph showing a time-dependent change in the outputs of the laser diode module of the invention and the conventional laser diode module using bonding wires.

FIG. 18 shows the results of measuring the output variation for 10,000 hours when the outputs of the two modules are repeatedly enabled and disabled at intervals of 1 second with the current of approximately 60 A let to flow in the modules. In FIG. 18, the horizontal axis shows the time (hours) and the vertical axis shows the output (W). The module according to the example of the invention showed an output drop ratio of 10% after 10,000 hours passed, whereas the conventional module showed a gradual output drop and had several wires disconnected after 1,000 hours passed, resulting in an abrupt output fall so that evaluation thereafter was interrupted.

Observation of the failed conventional module showed that as shown in FIG. 16, the end portion of a laser diode bar 1801 warped, so that disconnection occurred in bonding wires 1807 and the underlying mount interface with a hard solder layer 1803 was separated. A soft solder layer 1806 at the interface between a heat sink 1804 under the separated portion 1802 and a submount substrate 1805 was observed.

Figure 19:
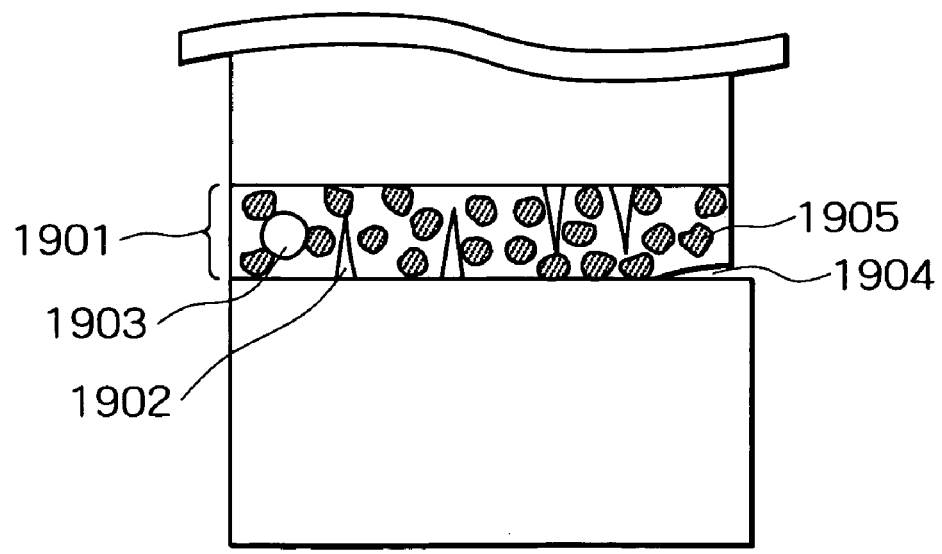
FIG. 19 is a cross-sectional view of a soft solder region under a separated portion of the conventional module shown in FIG. 16.

The result of the observation is shown in the cross-sectional view in FIG. 19. It is apparent that cracks 1902, voids 1903 and a separation 1904 are produced in an In solder layer 1901. Grains 1905 of a gold-In alloy were grown more than those immediately after mounting. By way of contrast, the In solder layer of the module of the module of the present invention did not have large cracks and voids even after passage of 10,000 hours and there was a slight status change in gold indium.

EXAMPLE 2

The members similar to those of Example 1 were used, a nickel layer of 1 µm in thickness was deposited on the top surface of only the heat sink, and the life test of the laser diode module was conducted while changing the thickness of the In layer from 1 µm to 10 µm as per Example 1. With the same experiment as illustrated in FIG. 6 conducted, a failure probability became 0.1% or less when the thickness of the In layer was 30 µm or greater. This is because nickel, when used, shows slow alloying with In, thus providing the reliability with a thinner In solder as compared with the use of gold. Through the same experiment as illustrated in FIG. 12 conducted, an output of 50 W was obtained when the current of 64 A was let to flow in the module and the thermal resistance of the junction part was larger than that in case gold was used. However, there is an output drop ratio of about 10% over 10,000 hours as in the case of the gold layer, which apparently raises no practical problem.

EXAMPLE 3

Figure 20:
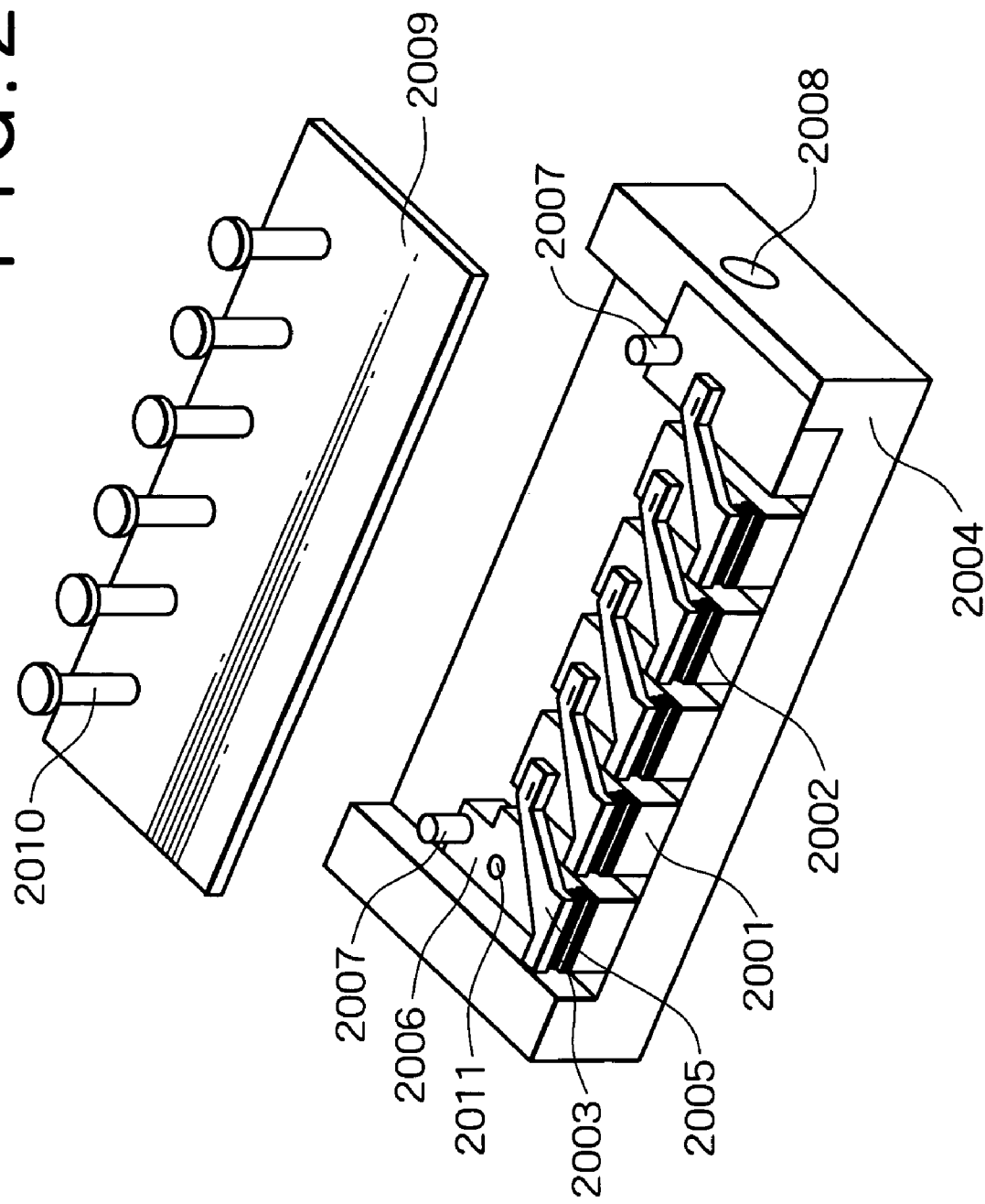
FIG. 20 is a perspective view showing an arrayed laser diode module having five laser diode modules according to the second embodiment of the invention.

FIG. 20 is a perspective view showing an arrayed laser diode module according to Example 3 of the invention. The arrayed laser diode module has five laser diode modules prepared in Example 1 arranged sideways. A sandwiched assembly 2002 formed by a laser diode bar mounted on a heat sink 2001 and submount substrates, and a coil electrode 2003 in use were the same as those of Example 1, and the sandwiched assembly 2002 was mounted on the heat sink 2001 with the same soft solder. A holder 2004 formed of an insulator to let water flow to the five heat sinks 2001 was prepared, and the individual heat sinks were secured at predetermined positions of the holder 2004. Then, individual bridge presser electrodes 2005 were laid out as shown in FIG. 20. The four bridge presser electrodes in use had the same shape, the left end was a bridge presser electrode 2006 for connecting the heat sink to an electrode terminal 2007 while a right end was a bridge presser electrode capable of bridging the electrode terminal 2007 at the back of the heat sink in such a way as not to contact the heat sink. Water is supplied to each heat sink from the coolant inlet formed in a side of the holder 2004. The entire arrayed module was covered with a presser plate 2009 for of an insulator to prevent electrode exposure and uniform pressing of the coil electrode, and was secured to the holder 2004 with a setscrew 2010 put through a screw hole formed in the electrode. The results of a long-term running experiment conducted on the arrayed module with the total output of 250 W or an output of 50 W per module as per Example 1 showed that Example 3 had an output variation of within 10% over 10,000 hours.

Figure 21:
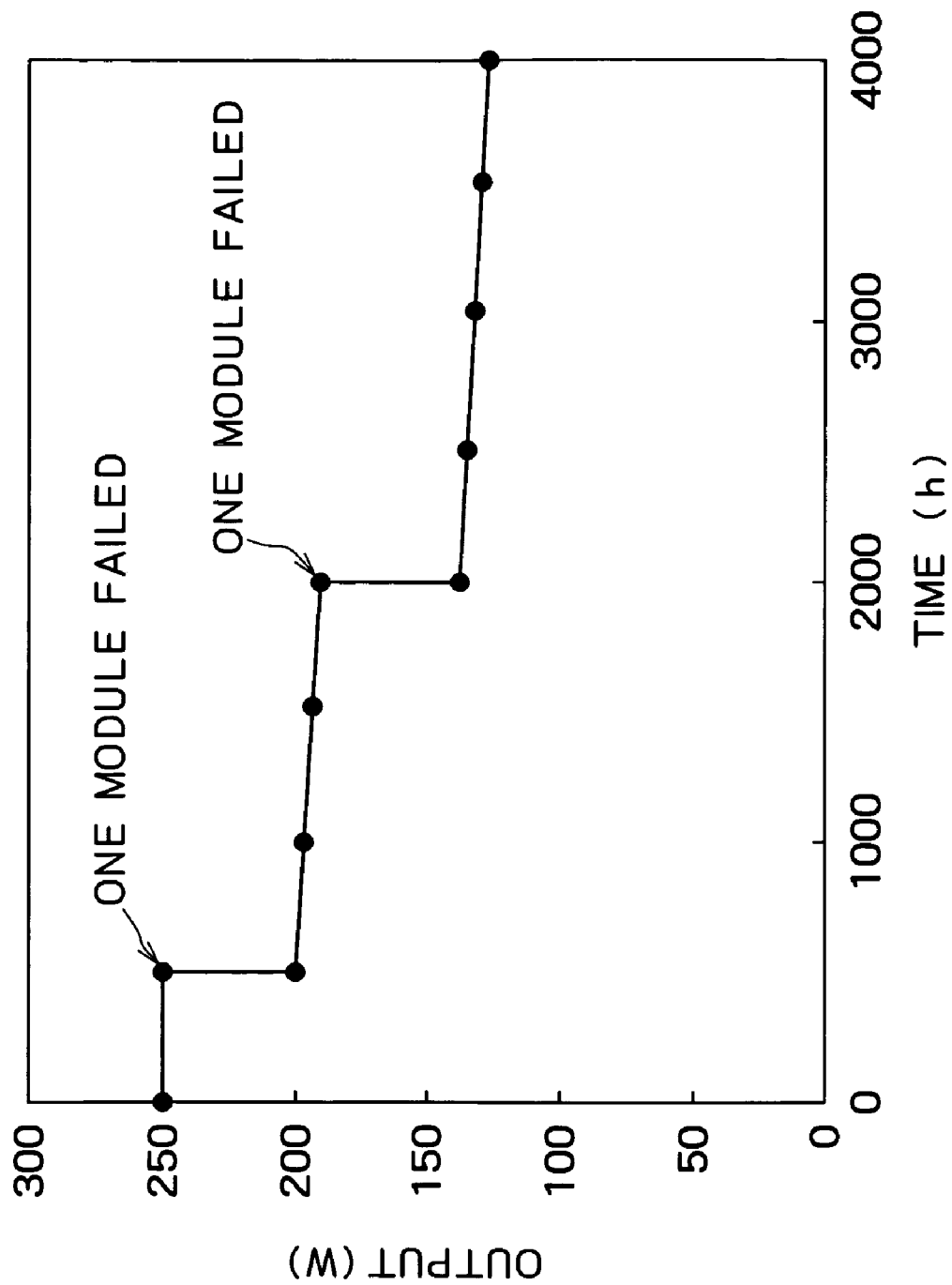
FIG. 21 is a graph showing a time-dependent change in the output of the arrayed laser diode module of the invention when a laser diode in the array is intentionally made to fail.

FIG. 21 shows the results of conducting an experiment of intentionally heating a single laser diode module to make the laser diode module fail after passage of 500 hours since running with 250 W started. One laser diode showed a rise in the temperature of the active layer and formation of a current leak path and stopped emitting light, but the electrode was not short-circuited and the current was kept flowing. As the current kept flowing in the other laser diode modules in the array, therefore, oscillation continued and an output of about 200 W was acquired. As another laser diode module was intentionally made to fail after 2,000 hours from the experiment started, resulting in that the output dropped to about 140 W. It was however confirmed that the other three modules provided stable outputs until 4,000 hours as shown in FIG. 21. Thereafter, the two failed laser diode modules were made to output light again after replacing the sandwiched assembly mounted on the heat sink of each module, resulting in that the laser outputs were restored to 240 W. As the module was not welded to other than the heat sink and the sandwiched assembly, it could be replaced easily with a replacement time of 10 minutes.

EXAMPLE 4

Figure 22:
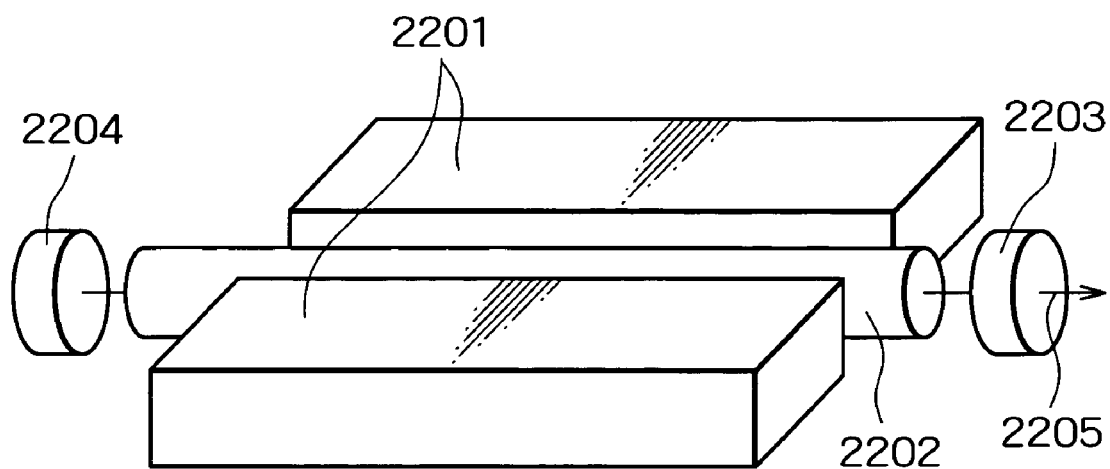
FIG. 22 is an exemplary diagram of a laser apparatus in which the laser diode module of the invention is used as a pumping light source.

FIG. 22 is a perspective view showing a laser apparatus according to Example 4 of the invention. The laser apparatus uses two sets of 5-module arrayed laser diode modules 2201 with an output of 250 W prepared in Example 3. The wavelength of the light that was generated from the arrayed laser diode module 2201 was adjusted to 808 nm, which was the neodymium absorption wavelength, with the temperature of the water flowing in the heat sink. A Nd:YAG laser rod 2202 with a diameter of 5 mm and a length of 10 cm and doped with neodymium by 1% was excited with the output laser beam from the module 2201 from both sides of the laser rod 2202. The module 2201 was laid near the laser rod 2202 in such a way that the entire excited light would be irradiated on the laser rod 2202. The light of 808 nm was absorbed by Nd in the Nd:YAG laser rod 2202, light with a wavelength of 1064 nm resonated between an output mirror 2003 and a rear mirror 2004, thus yielding an output light 2205 of 300 W from the laser rod 2202. The long-term running test was conducted while enabling and disabling the YAG laser output at intervals of 0.5 second of the laser diode module 2201. The YAG laser output continued over 10,000 hours and the output after 10,000 hours was 270 W, with an output drop ratio of 10% or less. Because the output drop of this level can be restored by increasing the value of the current which flows in the laser diode, the drop does not raise any problem in the specifications of the apparatus. The same running test was conducted on a laser apparatus which was excited with two sets of the conventional 5-module array of 250 W using bonding wires or a plate electrode for the upper electrode, resulting in that the laser diode module failed and stopped oscillating in 500 hours or so. The cause was a disconnection occurred in one laser diode bar in the 5-module array.

EXAMPLE 5

Figure 23:
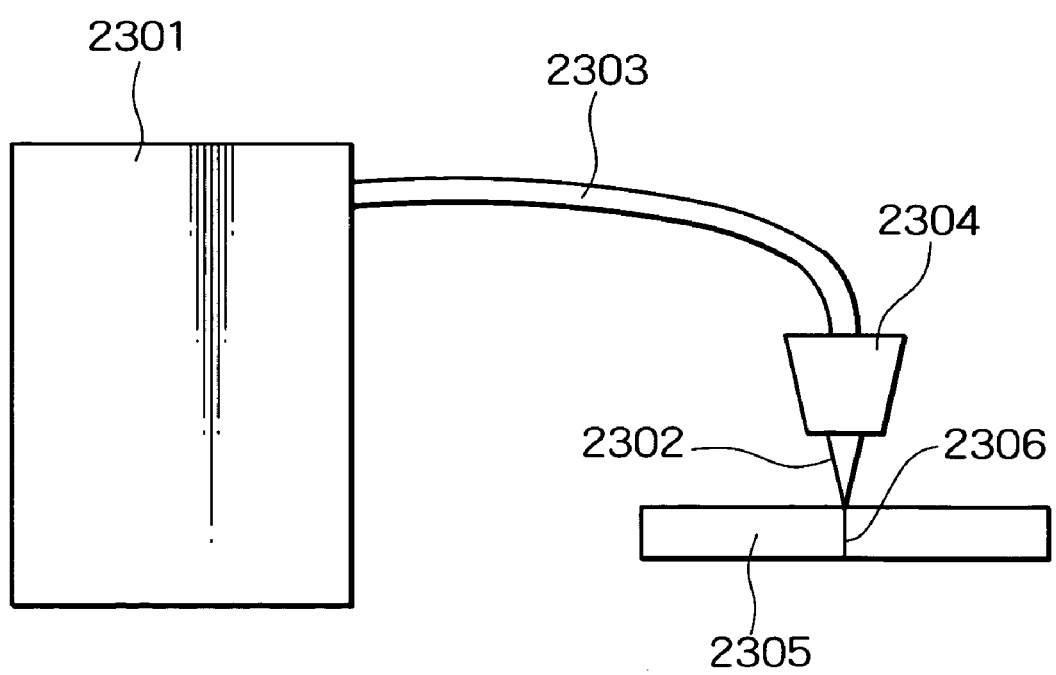
FIG. 23 is an exemplary diagram of a laser welding apparatus which uses a laser beam output from the laser apparatus that has the laser diode module of the invention used as the pumping light source.

FIG. 23 is a diagram showing a laser apparatus 2301 according to Example 5 of the invention. The laser apparatus 2301 is identical to the one prepared in Example 4 and includes the arrayed laser diode module 2201, the Nd:YAG laser rod 2202, the output mirror 2203 and the rear mirror 2204. A laser beam 2302 generated from the laser apparatus 2301 was coupled to an optical fiber 2303 whose end portion was connected to an objective lens 2304. With a pair of iron plates 2305 with a thickness of 1 mm abutting on each other, the objective lens 2304 focused the laser beam 2302 onto a welding line 2306 defined by the abutting faces, and scanning along the welding line 2306 with the laser beam 2302 was carried out to weld the two iron plates 2305. To efficiently weld plural locations, it is important to enable and disable the laser beam output. The laser diode module according to Example 5, even if turned on and off repeatedly, can operate stably over a long period of time, and if a single laser diode bar has a problem, the laser diode module operates without disconnection. Therefore, a laser processing apparatus equipped with the module of this example can perform stable welding over a long period of time. As the conventional high-power laser diode module could not operate stably over a long period of time if turned on and off repeatedly, a laser processing apparatus equipped with a laser apparatus using the conventional module would enable and disable the light generated from the laser apparatus by using a physical shutter. As the power of the laser beam became higher, however, problems would arise in terms of the heat resistivity of the shutter, the influence of reflected light and the shutter speed, and measures against the problems would require a considerable cost. Therefore, the conventional way of enabling and disabling a laser beam with a shutter was approaching its adaptational limitation.

What is claimed is:

1. A laser diode module comprising:
   a laser diode;
   a first substrate and a second substrate connected to both electrode surfaces of said laser diode via respective first solder layers;
   a heat sink connected to said first substrate via a second solder layer;
   a presser electrode arranged at a predetermined gap with respect to said heat sink; and
   a coil electrode provided between said second substrate and said presser electrode in such a way as to have an axial direction in parallel to said second substrate,
   whereby said presser electrode presses said coil electrode against said second substrate.

2. The laser diode module according to claim 1, wherein said presser electrode is fixed to said heat sink at a predetermined gap via an insulating spacer, and as said coil electrode is deformed elastically, said coil electrode is pressed against said second substrate.

3. The laser diode module according to claim 1, wherein said coil electrode has a gold layer coated on an outer surface of a coil wire.

4. The laser diode module according to claim 1, wherein said first substrate and said second substrate are connected to said the entire electrode surfaces of said laser diode in entirety.

5. The laser diode module according to claim 1, wherein a hard solder mainly containing an element selected from a group of Au, Ag, Al, Si and Ge is used for said first solder layer, a soft solder mainly containing an element selected from a group of Pb, Sn, In, Sb and Bi is used for said second solder layer, and said hard solder has a higher melting point than said soft solder.

6. The laser diode module according to claim 5, wherein a gold layer is coated on junction surfaces of said laser diode with respect to said first and second substrates, a gold layer is coated on junction surfaces of said first and second substrates with respect to said laser diode, and a hard solder comprised of an AuSn alloy is used for said first solder layer.

7. The laser diode module according to claim 1, wherein a first metal layer is formed on each of opposing surfaces of said heat sink and said first substrate, and an alloy phase is formed at an interface between said first metal layer and said second solder layer.

8. The laser diode module according to claim 7, wherein a ratio of said alloy phase to that of said second solder layer which remains unalloyed is controlled in such a way that said second solder layer after formation of said alloy phase on a top surface thereof has a sufficient thickness to relax deformation caused by a difference between a thermal expansion coefficient of said first substrate and a thermal expansion coefficient of said heat sink.

9. The laser diode module according to claim 1, wherein a gold layer is formed on each of opposing surfaces of said heat sink and said first substrate, and a soft solder of In is used for said second solder layer.

10. The laser diode module according to claim 9, wherein an alloy phase is formed between each of said gold layers formed on said opposing surfaces of said heat sink and said first substrate and an In layer of said second solder layer as gold is diffused in said In layer.

11. The laser diode module according to claim 10, wherein a ratio of said alloy phase to that of said In layer which remains unalloyed is controlled in such a way that said In layer after formation of said alloy phase on a top surface thereof has a sufficient thickness to relax deformation caused by a difference between a thermal expansion coefficient of said first substrate and a thermal expansion coefficient of said heat sink.

12. The laser diode module according to claim 1, wherein said laser diode is formed on a GaAs substrate, and said first and second substrates are formed of a copper-tungsten alloy.

13. An arrayed laser diode module having at least two laser diode modules recited in claim 1 arranged sideways, wherein that portion of said presser electrode which does not lie above said coil electrode is connected to the heat sink of an adjoining one of said laser diode modules.

14. A laser apparatus which uses a laser diode module recited in claim 1 as a pumping source for a solid-state laser crystal.

15. A laser processing apparatus comprising:
   a laser apparatus incorporating a laser diode module recited in claim 1;
   an optical fiber for stimulating light generated from said laser apparatus;
   a lens for condensing light output from said optical fiber; and
   an irradiation system which irradiates a laser beam condensed at a predetermined position.

* * * * *